(12) United States Patent
Mawst et al.

(10) Patent No.: US 12,413,047 B2
(45) Date of Patent: Sep. 9, 2025

(54) HIGH-POWER, SINGLE-SPATIAL-MODE QUANTUM CASCADE LASERS

(71) Applicant: Wisconsin Alumni Research Foundation, Madison, WI (US)

(72) Inventors: Luke J. Mawst, Sun Prairie, WI (US); Thomas L. Earles, Verona, WI (US); Christopher A. Sigler, Dayton, OH (US); Dan Botez, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 152 days.

(21) Appl. No.: 17/768,052

(22) PCT Filed: Sep. 24, 2020

(86) PCT No.: PCT/US2020/052360
§ 371 (c)(1),
(2) Date: Apr. 11, 2022

(87) PCT Pub. No.: WO2021/076291
PCT Pub. Date: Apr. 22, 2021

(65) Prior Publication Data
US 2024/0097404 A1   Mar. 21, 2024

Related U.S. Application Data

(60) Provisional application No. 62/915,695, filed on Oct. 16, 2019.

(51) Int. Cl.
*H01S 3/04* (2006.01)
*H01S 5/10* (2021.01)
(Continued)

(52) U.S. Cl.
CPC .......... *H01S 5/3402* (2013.01); *H01S 5/1064* (2013.01); *H01S 5/1228* (2013.01);
(Continued)

(58) Field of Classification Search
CPC .... H01S 5/3402; H01S 5/1064; H01S 5/1228; H01S 5/1246; H01S 5/1039; H01S 2301/166; H01S 2301/01
See application file for complete search history.

(56) References Cited

U.S. PATENT DOCUMENTS 6,608,855 B1 *  8/2003  Hwang ............... H01S 5/12
                                         372/45.01
6,638,773 B1 * 10/2003  Hwang ............ H01S 5/1082
                                              438/46

(Continued)

FOREIGN PATENT DOCUMENTS

| EP | 0814547 | 12/1997 |
| KR | 10-1137558 | 4/2012 |
| WO | WO00/05792 | 2/2000 |

OTHER PUBLICATIONS

Rana et al., "Tapered Cavities for High-Modulation-Efficiency and Low-Distortion Semiconductor Lasers," *IEEE Journal of Quantum Electronics*, vol. 43, No. 11, Nov. 2007, pp. 1083-1087.

(Continued)

*Primary Examiner* — Kinam Park
(74) *Attorney, Agent, or Firm* — Bell & Manning, LLC

(57) ABSTRACT

Single-mode quantum cascade semiconductor lasers are provided. The lasers comprise a laser element, the laser element comprising a quantum cascade active layer; an upper cladding layer over the quantum cascade active layer; and a lower cladding layer under the quantum cascade active layer, wherein the quantum cascade active layer, the upper cladding layer and the lower cladding layer define a guided (Continued)

optical mode. The quantum cascade active layer and the upper and lower cladding layers are shaped in the form of a ridge structure having a front face, a back face opposite the front face, and a lasing face through which laser emission exits the ridge structure, the ridge structure configured such that the laser emission has a single-lobe, far-field beam pattern from the ridge structure comprising certain sections, including tapered sections, collateral sections, or both.

26 Claims, 20 Drawing Sheets

(51) Int. Cl.
*H01S 5/12* (2021.01)
*H01S 5/34* (2006.01)

(52) U.S. Cl.
CPC ........ *H01S 5/1246* (2013.01); *H01S 5/1039* (2013.01); *H01S 2301/166* (2013.01); *H01S 2301/18* (2013.01)

(56) References Cited

U.S. PATENT DOCUMENTS

| | | | | |
|---|---|---|---|---|
| 7,403,552 | B2* | 7/2008 | Botez | H01S 5/3407 977/951 |
| 7,457,338 | B2* | 11/2008 | Mawst | B82Y 20/00 372/45.011 |
| 9,093,821 | B2 | 7/2015 | Mawst et al. | |
| 2015/0007658 | A1 | 1/2015 | Ishikawa et al. | |
| 2015/0162724 | A1* | 6/2015 | Mawst | H01S 5/3401 372/45.012 |
| 2019/0319426 | A1* | 10/2019 | Lu | H01S 5/2226 |
| 2023/0036709 | A1* | 2/2023 | Shin | H01S 5/3401 |

OTHER PUBLICATIONS

Sigler et al., "Design for high-power, single-lobe, grating-surface-emitting quantum cascade lasers enabled by plasmon-enhanced absorption of antisymmetric modes," *Applied Physics Letters*, 104, 131108 (2014).
Bai et al., "Room temperature quantum cascade lasers with 27% wall plug efficiency," *Appl. Phys. Lett.* 98, 181102 (2011).
Bai et al., "Highly temperature insensitive quantum cascade lasers," *Applied Physics Letters*, 97, 251104 (2010).
Zhao et al., "Tapered Quantum Cascade Laser Arrays Integrated with Talbot Cavities," *Nanoscale Research Letters*, (2018) 13:205.
Troccoli et al., "Mid-infrared ($\lambda$=7.4 µm) quantum cascade laser amplifier for high power single-mode emission and improved beam quality," *Applied Physics Letters*, vol. 80, No. 22, Jun. 3, 2022, 4 pages.
Lyakh et al., "Tapered 4.7 µm quantum cascade lasers with highly strained active region composition delivering over 4.5 watts of continuous wave optical power," *Optics Express*, vol. 20, No. 4, Feb. 2012, 7 pages.
Menzel et al., "Quantum cascade laser master-oscillator power-amplifier with 1.5 W output power at 300 K," *Optics Express*, vol. 19, No. 17, Aug. 15, 2011, 7 pages.
International Search Report and Written Opinion for PCT/US2020/052360, mailed Jan. 12, 2021.
Halioua et al., "Phase-locked arrays of surface-emitting graded-photonic-heterostructure terahertz," *Optics Express*, vol. 23, No. 5, Mar. 9, 2015, 9 pages.
Schwarzer, et al., "Linearly polarized light from substrate emitting ring cavity quantum cascade lasers," Applied Physics Letters, Aug. 19, 2013, 4 pages, vol. 103, https://doi.org/10.1063/1.4819034.
Witjaksono, et al., "Surface-emitting, single-lobe operation from second-order distributed-reflector lasers with central grating phaseshift," Applied Physics Letters, Jun. 25, 2001, 4 pages, vol. 78, No. 26, http://dx.doi.org/10.1063/1.1382633.

* cited by examiner

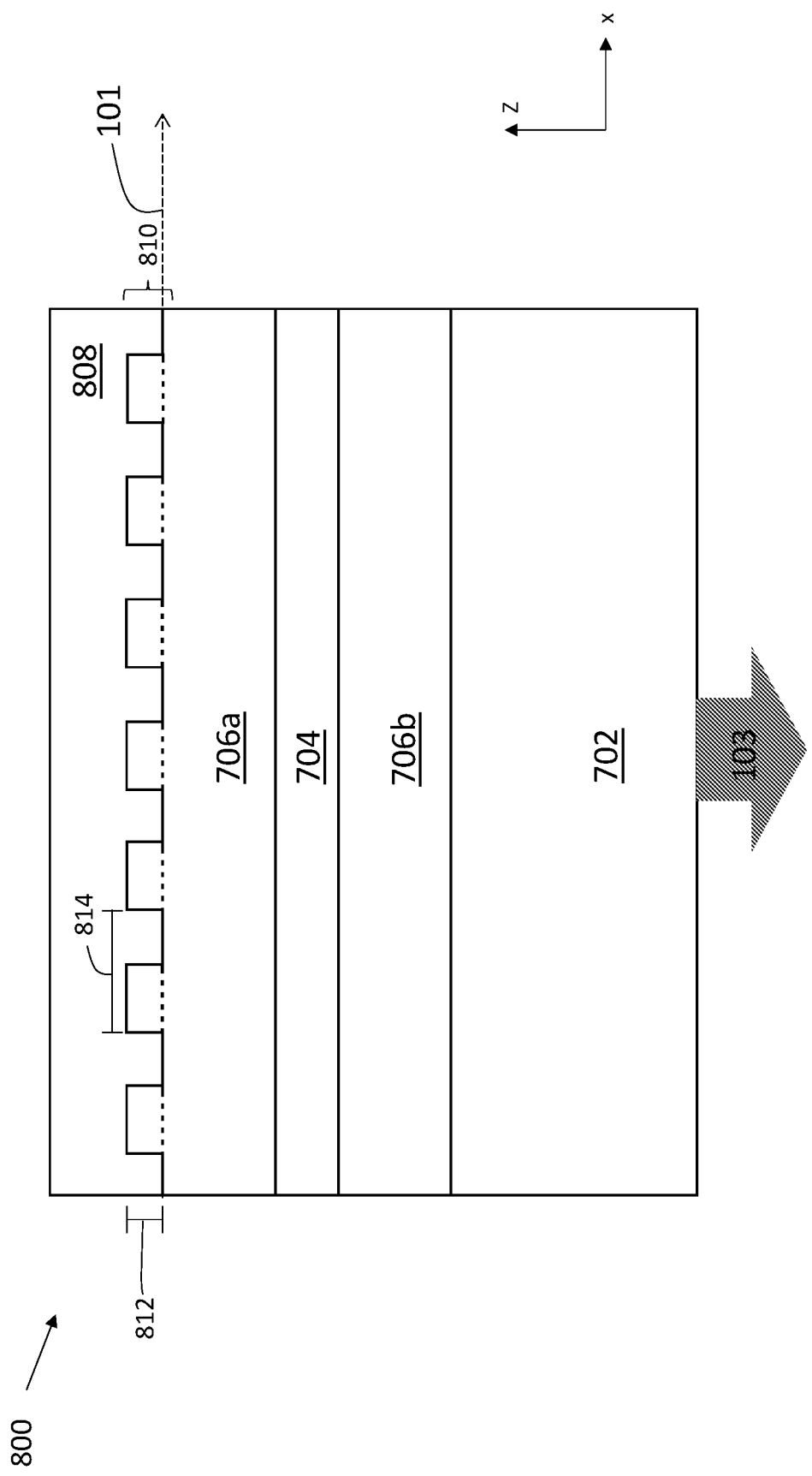

HIGH-POWER, SINGLE-SPATIAL-MODE QUANTUM CASCADE LASERS

This application is a National Stage of International Application No. PCT/US20/052360, filed Sep. 24, 2020, which claims the benefit of U.S. provisional patent application No. 62/915,695 that was filed Oct. 16, 2019, the entire contents of both of which are incorporated herein by reference.

This invention was made with government support under W911NF-16-C-0116 awarded by the ARMY/ARO, FA8650-13-2-1616 awarded by the USAF/AFOSR and N68335-13-0333 awarded by the NAVY/ONR. The government has certain rights in the invention.

BACKGROUND

Single-element, edge-emitting quantum cascade lasers (QCLs) operating in the important 4.5-5.0 μm wavelength region generally require a relatively narrow element width (~5-6 μm) to maintain stable, single-spatial-mode continuous wave (CW) operation up to the 1.5-2.0 watt-range output power levels. Higher CW output powers (~5 W) have been achieved at the expense of multi-mode operation (Y. Bai, et al., "Room temperature quantum cascade lasers with 27% wall plug efficiency," Appl. Phys. Lett. 98, 181102 (2011)), as evidenced by beam steering with increasing drive level (Y. Bai, et al., "Highly temperature insensitive quantum cascade lasers," Appl. Phys. Lett. 97, 251104 (2010)). The same narrow ridge is required for grating coupled surface-emitting QCLs, in order to maintain single-lateral-mode operation to high CW output powers. External beam combining many single-element QCLs offers a path to scale the coherent output power of a mid-IR emitting source of high brightness. However, all beam combining approaches would directly benefit from increasing the available single-mode output power from the individual lasers to be combined.

SUMMARY

Provided herein are semiconductor quantum cascade laser devices configured for single-mode operation, producing laser emission having a single-lobe, far-field beam pattern, including at high output powers.

In one aspect, single-mode quantum cascade semiconductor lasers are provided. The lasers comprise a laser element, the laser element comprising a quantum cascade active layer; an upper cladding layer over the quantum cascade active layer; and a lower cladding layer under the quantum cascade active layer, wherein the quantum cascade active layer, the upper cladding layer and the lower cladding layer define a guided optical mode. The quantum cascade active layer and the upper and lower cladding layers are shaped in the form of a ridge structure having a front face, a back face opposite the front face, and a lasing face through which laser emission exits the ridge structure, the ridge structure configured such that the laser emission has a single-lobe, far-field beam pattern from the ridge structure comprising certain sections.

The ridge structure may comprise a tapered section having diverging sides between the front face and the back face which diverge away from one another and towards the back face to define a maximum width $w_M$, wherein the lasing face has a width $w_m$ and $w_M > w_m$, and the ridge structure is edge-emitting.

The ridge structure may comprise a tapered section having diverging sides between the front face and the back face which diverge away from one another and towards the back face to define a maximum width $w_M$, the ridge structure further comprising a distributed feedback grating and first face having a width $w_m$ between the front face and the back face wherein $w_M > w_m$, and the ridge structure is surface-emitting having the lasing face perpendicular to the front, the back, and the another faces.

The ridge structure may comprise a collateral section having parallel sides between the front face and the back face, the ridge structure further comprising a distributed feedback grating configured to suppress one or more symmetric longitudinal modes so as to produce lasing in an antisymmetric longitudinal mode, the distributed feedback grating further comprising a $\pi$ phase-shifting region, wherein the ridge structure is surface-emitting having the lasing face perpendicular to the front and the back faces.

The ridge structure may comprise a collateral section having parallel sides between the front face and the back face and a first connecting portion having outer and inner sides, both of which extend away from the back face and towards the front face, the first connecting portion configured to optically couple the front face to the back face, the ridge structure further comprising a distributed feedback grating configured to suppress an antisymmetric longitudinal mode so as to produce lasing in a symmetric longitudinal mode, the distributed feedback grating further comprising $\pi$ phase-shifting regions, wherein the ridge structure is continuous and surface-emitting having the lasing face perpendicular to the front and the back faces.

Other principal features and advantages of the disclosure will become apparent to those skilled in the art upon review of the following drawings, the detailed description, and the appended claims.

BRIEF DESCRIPTION OF THE DRAWINGS

Illustrative embodiments of the disclosure will hereafter be described with reference to the accompanying drawings.

FIG. 8 shows a longitudinal cross-section view of another illustrative laser element.

DETAILED DESCRIPTION

Figure 1:
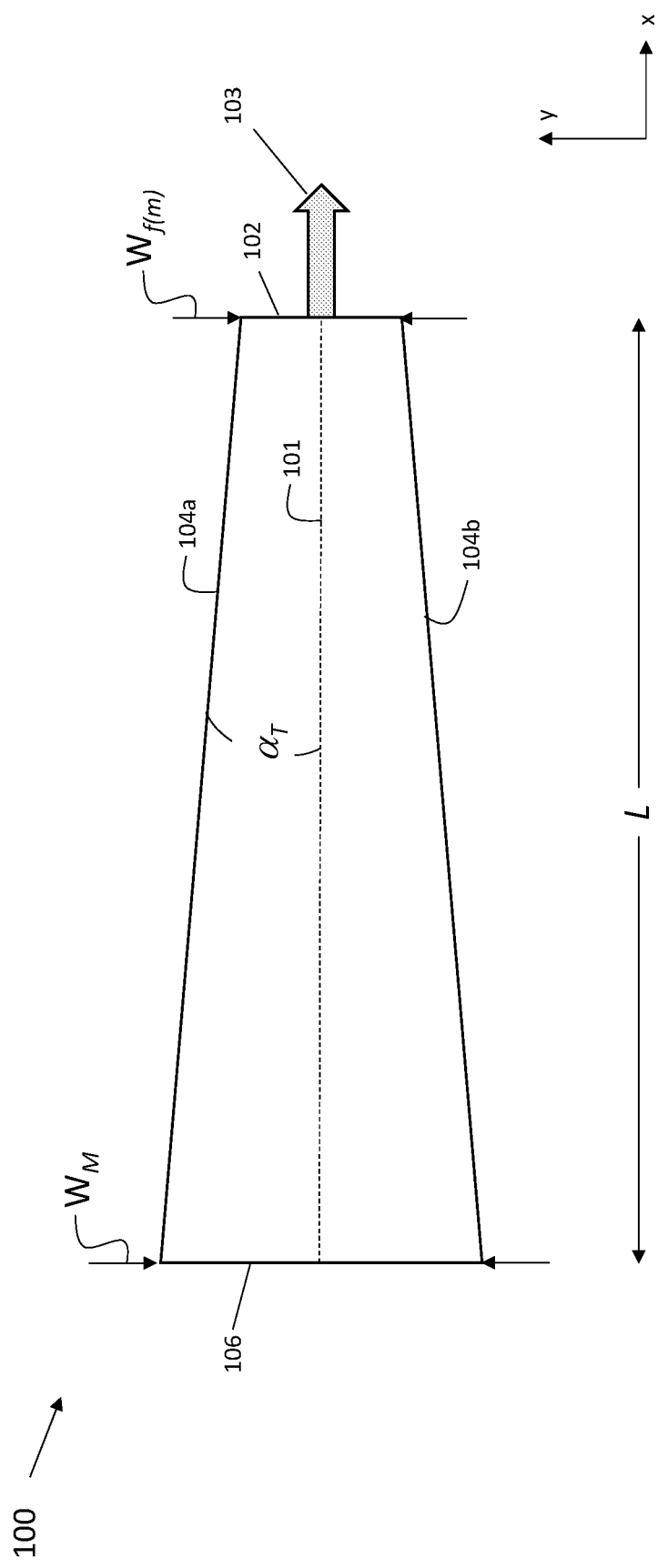
FIG. 1 shows a top down view of an illustrative tapered laser element formed as a linear ridge structure having a single tapered section.

Provided herein are semiconductor quantum cascade laser (QCL) devices configured for single-mode operation, producing laser emission having a single-lobe, far-field beam pattern, including at high output powers. It has been found that such high power, single-mode operation may be achieved using unconventional approaches. First, this may be achieved by incorporating certain tapered laser elements into semiconductor QCL devices. Throughout the present disclosure, the term taper, tapered, tapering, etc. may be used interchangeably with the terms flare, flared, flaring, etc. Although tapering has been used in some existing edge-emitting diode and edge-emitting QCL devices, the tapering has been such that laser emission exits the tapered laser element through its wide facet in order to reduce power density and prevent perceived device failure due to catastrophic optical damage. Embodiments of the present tapering approach are directly opposite in that the laser emission exits through a narrow facet. Thus, the present tapering approach involves "reverse tapering." Although the power density across the narrower facets is quite high (and, in fact, higher than in similarly configured semiconductor diode lasers), adoption of the reverse tapering is based on the inventors' insight that such high-power densities are not problematic for edge-emitting quantum cascade laser devices.

Second, laser elements (whether tapered or untapered) may comprise a distributed feedback (DFB) grating having a configuration that suppresses one or more symmetric longitudinal modes so as to produce lasing in an antisymmetric longitudinal mode. In this case, the single-lobe beam operation is recovered by incorporating a $\pi$ phase-shifting region in the center of the DFB grating. This is by contrast to existing approaches which have configured DFB gratings to do the opposite, i.e., suppress one or more antisymmetric longitudinal modes in favor of a symmetric longitudinal mode. Adoption of antisymmetric longitudinal mode operation is based on the inventors' insight that such devices have a significantly and surprisingly greater fabrication tolerance than those based on symmetric longitudinal mode operation.

Third, laser elements (whether tapered or untapered) in the form of continuous ridge structures may be used. Continuous ridge structures may also be referred to as "race track" configurations. In such configurations, front faces and back faces within the structures are optically coupled/connected via a connecting portion(s) so as to form a waveguide of "infinite" length. This has the advantage of more than doubling the light outcoupling efficiency/output power. Continuous ridge structures comprise a DFB grating. The DFB grating may be configured as described above or may be configured to suppress one or more antisymmetric longitudinal modes in favor of a symmetric longitudinal mode, which allows for high outcoupling efficiency.

These approaches all provide single-mode operation at high output powers, including about a factor of two greater than existing QCL devices. In addition, for edge-emitting devices, the laser emission advantageously exits as a beam having a circular profile (as opposed to an elliptical profile). For surface-emitting devices, as noted above, the present laser element configurations offer either greater fabrication tolerances (antisymmetric longitudinal mode) or higher light-outcoupling efficiency (symmetric longitudinal mode) as compared to existing single-mode surface-emitting devices.

The present semiconductor QCL devices find use in a variety of applications including medical imaging, materials processing, remote sensing, infrared countermeasures and free-space optical communications.

The present semiconductor QCL devices comprise a laser element shaped in the form of a ridge structure, which may be linear or continuous. Tapered laser elements have one or more tapered sections, and optionally, one or more collateral sections. Untapered laser elements have one or more collateral sections. The ridge structure has a front facet (or front face) and a back facet (or back face) opposite the front facet. (As used throughout the present disclosure, the term "face" can refer to, but does not necessarily refer to, a physical component of the present laser elements/devices. The term "face" can simply connote a reference plane or surface therein.) Sides extend between the front facet/face and the back facet/face. Tapered laser elements have at least one tapered section having sides which diverge away from one another (i.e., are non-parallel to one another) and towards the back facet/face. Sides of collateral section(s) extend parallel to one another. The ridge structure also has a lasing face, a surface through which laser emission exits. As further described below, depending on whether the ridge structure is edge-emitting or surface-emitting, the lasing face is either the front facet (edge-emitting) or a face perpendicular thereto (surface-emitting).

Figure 13:
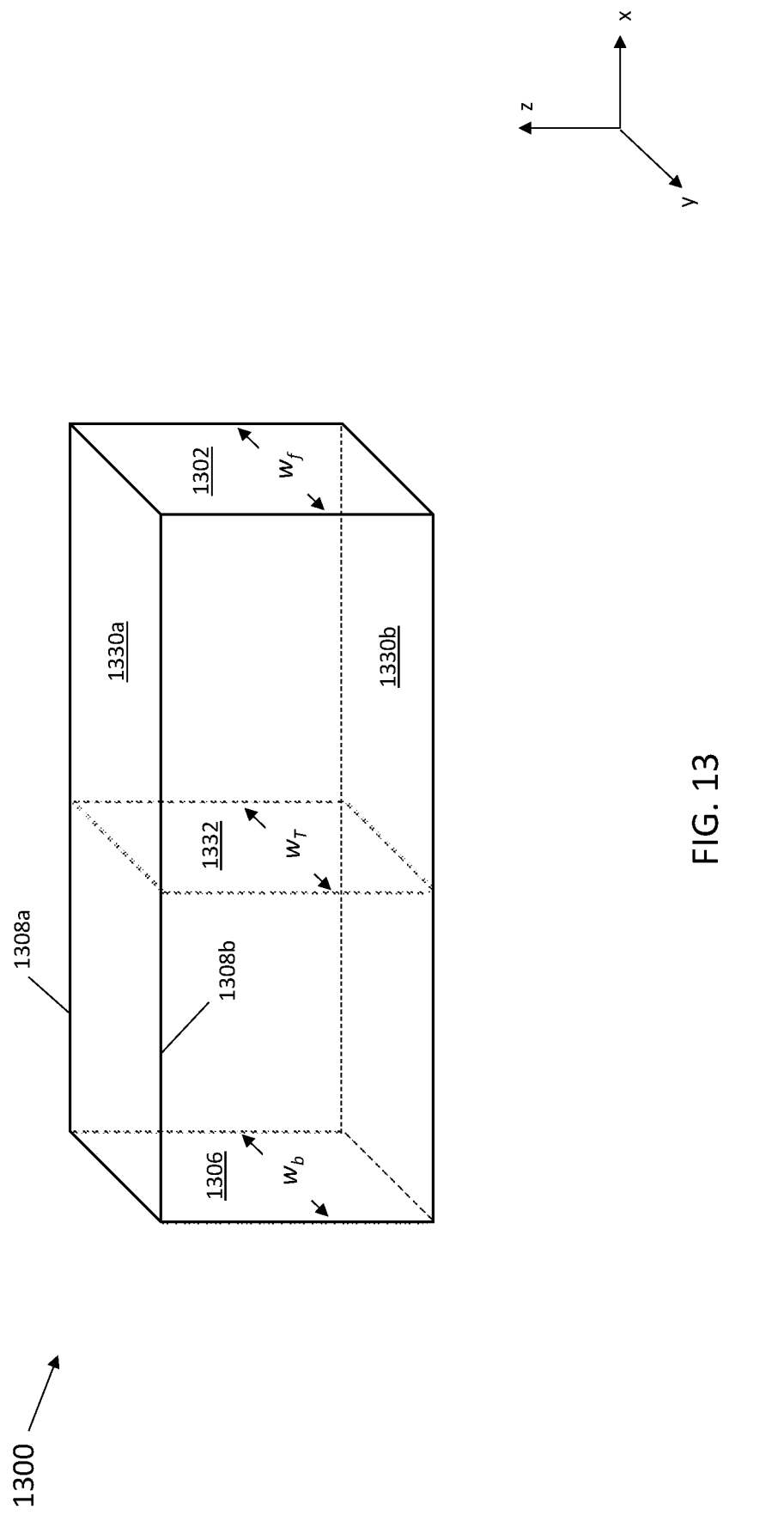
FIG. 13 shows a perspective view of an untapered linear ridge structure.

The various faces and dimensions of the present laser elements are illustrated with reference to FIG. 13. A perspective view of an untapered linear ridge structure 1300 is shown. (As noted above, tapered linear ridge structures have tapered sections, which are not shown in FIG. 13.) Also labeled are a front facet/face 1302, a back facet/face 1306, sides 1308a, 1308b, an upper face 1330a, a lower face 1330b, and another face 1332 within the structure. The structure 1300 has a longitudinal dimension which is taken along the x axis. (Also see the x axis in FIGS. 1-6.) Each facet/face of the structure 1300 is characterized by a width which is taken along the y axis. (Also see the y axis in FIGS. 1-6.) The width of the front facet/face 1302 is $w_f$, the width of the back facet/face 1306 is $w_b$, and the width of the other face 1332 is $w_T$. In untapered linear ridge structures, $w_f=w_T=w_b$. These widths also correspond to the widths of the upper and lower faces 1330a, b. If the structure 1300 is configured to be edge-emitting, the front facet 1302 is also the lasing face through which laser emission exits. If the structure 1300 is configured to be surface-emitting, either the upper or lower face 1330a, b is the lasing face through which the laser emission exits.

As noted above, tapered laser elements have at least one tapered section having sides which diverge away from one another and towards the back facet/face. The diverging sides extend to a maximum width $w_M$ (which may also be the maximum width across the laser element, i.e., the largest width across the laser element). The diverging sides may extend away from the front facet having the width $w_f$ wherein $w_M>w_f$. The diverging sides may extend away from another face of the tapered section having the width $w_T$ wherein $w_M>w_T$. In embodiments, the width $w_f$ or the width $w_T$ is a minimum width $w_m$ in the tapered section (which may also be the minimum width across the laser element, i.e., the smallest width across the laser element). In tapered edge-emitting laser elements, the front facet having the width $w_f$ is the lasing face and $w_M>w_f$. In tapered surface-emitting laser elements, the width of the lasing face may actually vary, e.g., spanning from $w_T$ to $w_M$.

Figure 7:
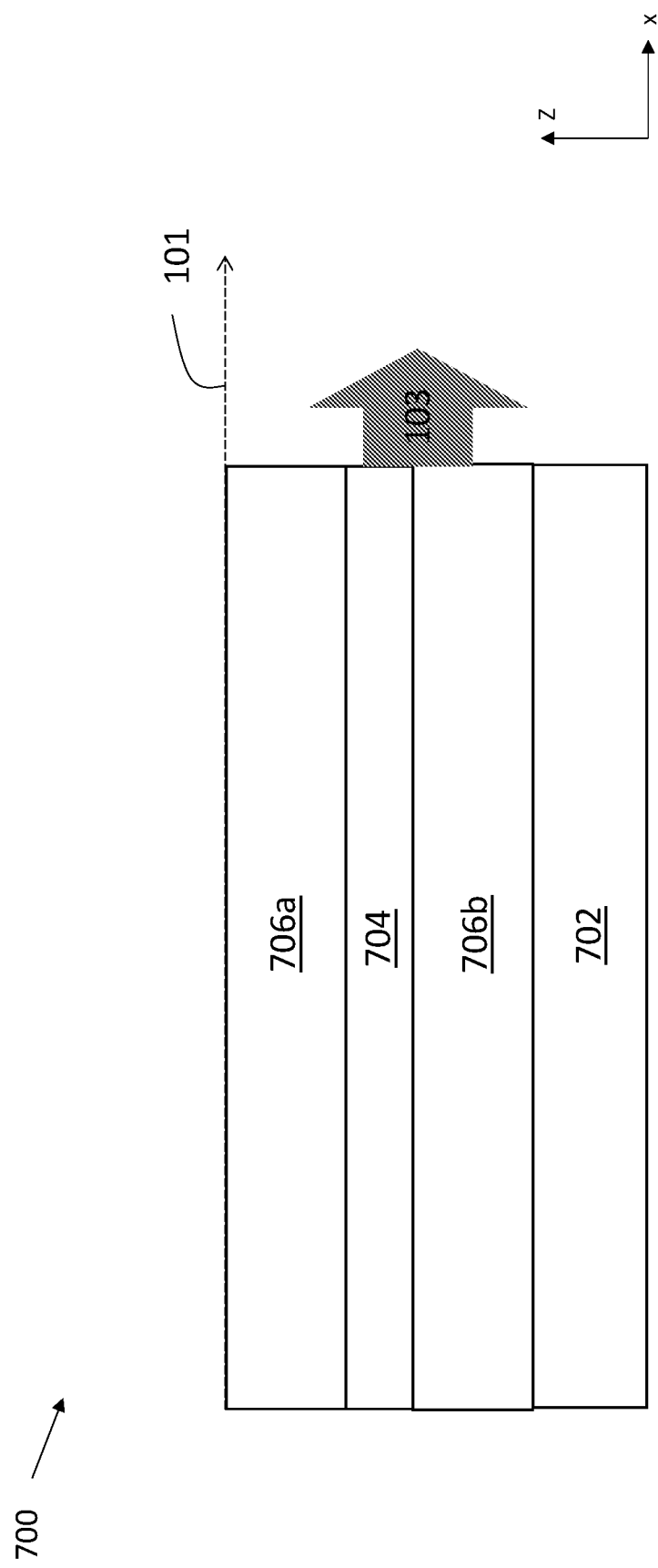
FIG. 7 shows a longitudinal cross-section view of an illustrative laser element.

The present laser elements comprise a quantum cascade active layer, an upper cladding layer over the quantum cascade active layer, and a lower cladding layer under the quantum cascade active layer. The phrase "quantum cascade active layer" refers to a multilayer structure comprising multiple layers of semiconductor. The composition and arrangement of the semiconductor layers is that which, when under electrical bias, generates light when electrons within a given energy subband relax between quantized states of an active region formed by a subset of the semiconductor layers. Illustrative multilayer structures are shown in FIGS. 7 and 8 and are further described below. The dielectric waveguide formed by the quantum cascade active layer and the surrounding cladding layers define a guided optical mode. The guided optical mode is fully guided by these layers, as distinguished from quantum cascade laser devices which include additional components allowing generated light to freely propagate therein (e.g., Talbot cavities). Quantum cascade laser devices and quantum cascade active layers are also distinguished from diode laser devices and diode active layers in which the mechanism of light generation involves the recombination of electrons and holes.

As noted above, the present laser elements may be edge-emitting such that optical feedback produces laser emission through the front facet (lasing face) of the laser element. That optical feedback may be provided by the front and back facets, both of which may be cleaved and appropriately coated. Alternatively, the laser elements may further comprise a DFB grating or distributed Bragg reflector (DBR) gratings or both instead of cleaved front/back facets. In such embodiments, the optical feedback is provided by the DFB/DBRs.

In other embodiments, the present laser elements are surface-emitting and a DFB grating produces laser emission through a surface perpendicular to the front facet/face of the laser element, i.e., an upper or lower face as described above. For such embodiments the DFB grating further provides the optical feedback. Such embodiments may further comprise DBR gratings, for additional optical feedback and surface emission.

As further described below with reference to FIGS. 1 to 6, the ridge structures (particularly the one or more tapered sections and optionally, one or more collateral sections), of the tapered laser elements are configured to ensure that the laser emission has a single-lobe, far-field beam pattern. However, more than one single-lobe beam may be emitted in certain embodiments, e.g., those having a DFB/DBR grating having an order greater than 2. As demonstrated in the Examples below, laser element configurations have been found which achieve significant increases in output power but without degrading beam quality. The laser element (whether tapered or untapered) may be the only laser element in the laser device, as distinguished from laser devices comprising an array of laser elements.

FIG. 1 shows a top view of an illustrative laser element 100. As noted above and throughout the present disclosure, the xy plane defines the lateral dimensions of the present laser elements/devices. Widths are taken along the y direction and lengths along the x direction. The z axis extends out of the xy plane. In addition, the dashed line 101 marks the direction of the longitudinal dimension of the present laser elements/devices.

The laser element 100 is in the form of a linear ridge structure which is tapered and may be formed on a surface of an underlying substrate (not shown). The linear ridge structure has a front facet 102 having a width w and sides 104a, b extending to a back facet 106 opposite the front facet 102. In this embodiment, the linear ridge structure has only a single tapered section and the sides 104a, b diverge away from the front facet 102 to the back facet 106. The diverging sides 104a, b define a maximum width $w_M$, which, in this embodiment, also corresponds to the width of the back facet 106 ($w_b$). The width $w_M$ is greater than the width $w_f$. In this embodiment, the width $w_f$ of the front facet 102 is also the minimum width $w_m$ in the linear ridge structure; the width $w_M$ is also the maximum width in the linear ridge structure. As shown in FIG. 1, the diverging sides 104a, b may be straight (uncurved), in which case the degree of divergence is given by the half angle $\alpha_T$. However, the diverging sides 104a, b may be curved. The curve may be a parabolic curve, in which case the degree of divergence is given by $$W_M = \sqrt{\frac{2\alpha\lambda z}{n_{eff}} + w_0^2}$$

wherein $\alpha$ is a constant less than 1, $\lambda$ is the wavelength of the laser emission, z is the positive distance from the $w_0$ plane, nay is the effective refractive index for $\lambda$ of the quantum cascade active layer, and $w_0=w_f$. The laser cavity length is given by L.

As shown in FIG. 1, the laser element 100 is edge-emitting such that optical feedback produces laser emission 103 through the front facet 102. Since $w_M>w_f$, the laser light actually exits through the narrowest facet. As noted above, such a configuration is contrary to conventional wisdom that laser light should exit though the widest facet in order to prevent catastrophic optical damage.

Figure 2:
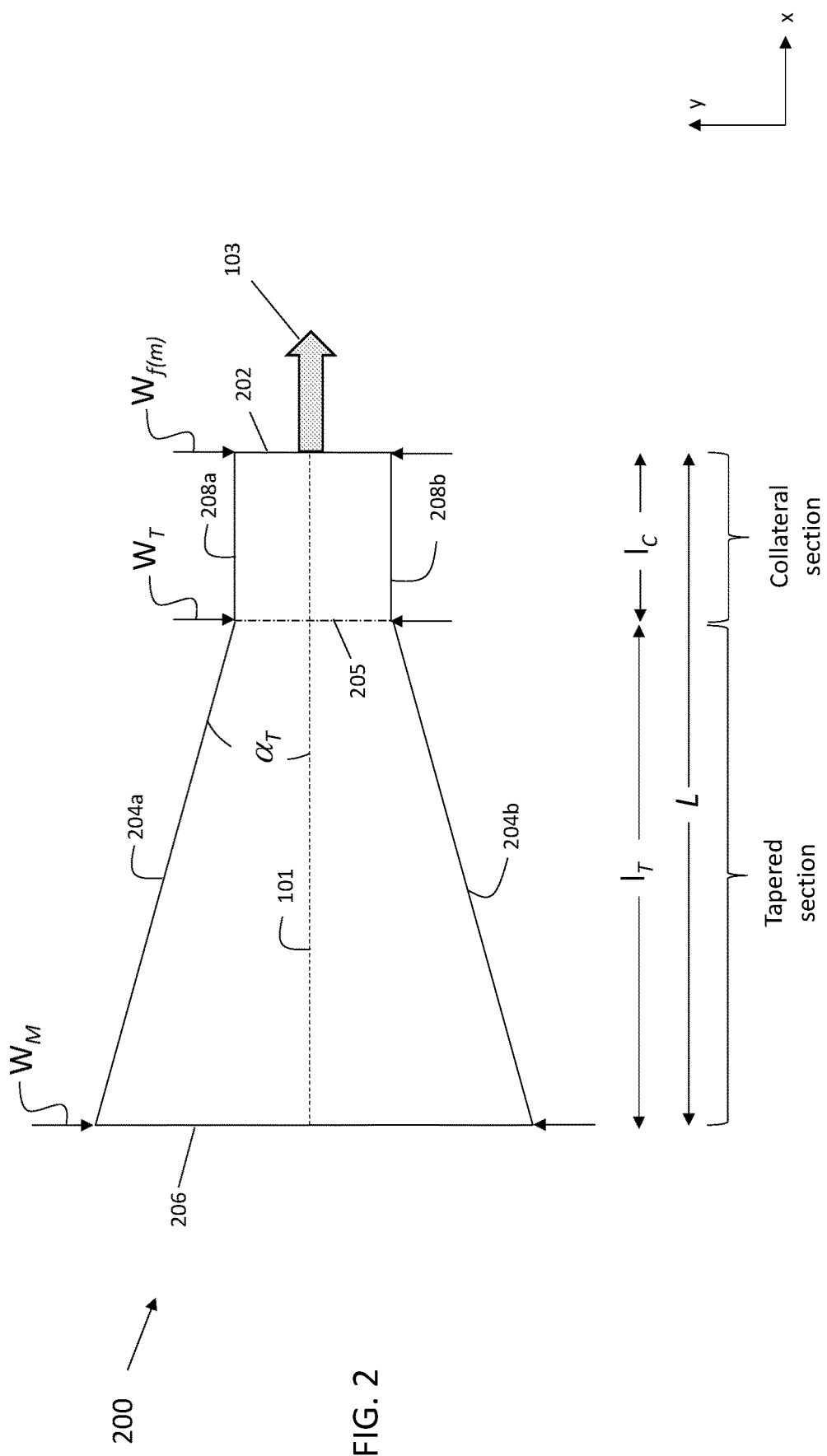
FIG. 2 shows a top down view of an illustrative tapered laser element formed as a linear ridge structure having a single tapered section adjacent to a single collateral section.

FIG. 2 shows a top view of another illustrative laser element 200. The laser element 200 is also in the form of a linear ridge structure which is tapered having a front facet 202 and a back facet 206 opposite the front facet 202. However, in this embodiment, the linear ridge structure has two sections, a tapered section and a collateral section. The collateral section has the front facet 202 having a width w and parallel sides 208a, b extending away from the front facet 202 to a first face 205 opposite the front facet 202. The tapered section has sides 204a, b which diverge away from the first face 205 to the back facet 206. The first face 205 has a width $w_T$, wherein $w_T=w_f$. The diverging sides 204a, b extend to a maximum width $w_M$, which, in this embodiment, also corresponds to the width of the back facet 206 ($w_b$). The width $w_M$ is greater than the widths $w_T$, $w_f$. In this embodiment, the width $w_f$ of the front facet 202 (the lasing face) is also the minimum width $w_m$ in the linear ridge structure; the width $w_M$ is also the maximum width in the linear ridge structure. The diverging sides 204a, b may be straight (uncurved) or curved (e.g., parabolic). The length of the collateral section is given by $l_C$, the length of the tapered section is given by $l_T$, and the laser cavity length is given by $L(l_C+l_T)$. As shown in FIG. 2, the laser element 200 is particularly useful as an edge-emitting embodiment.

Figure 3:
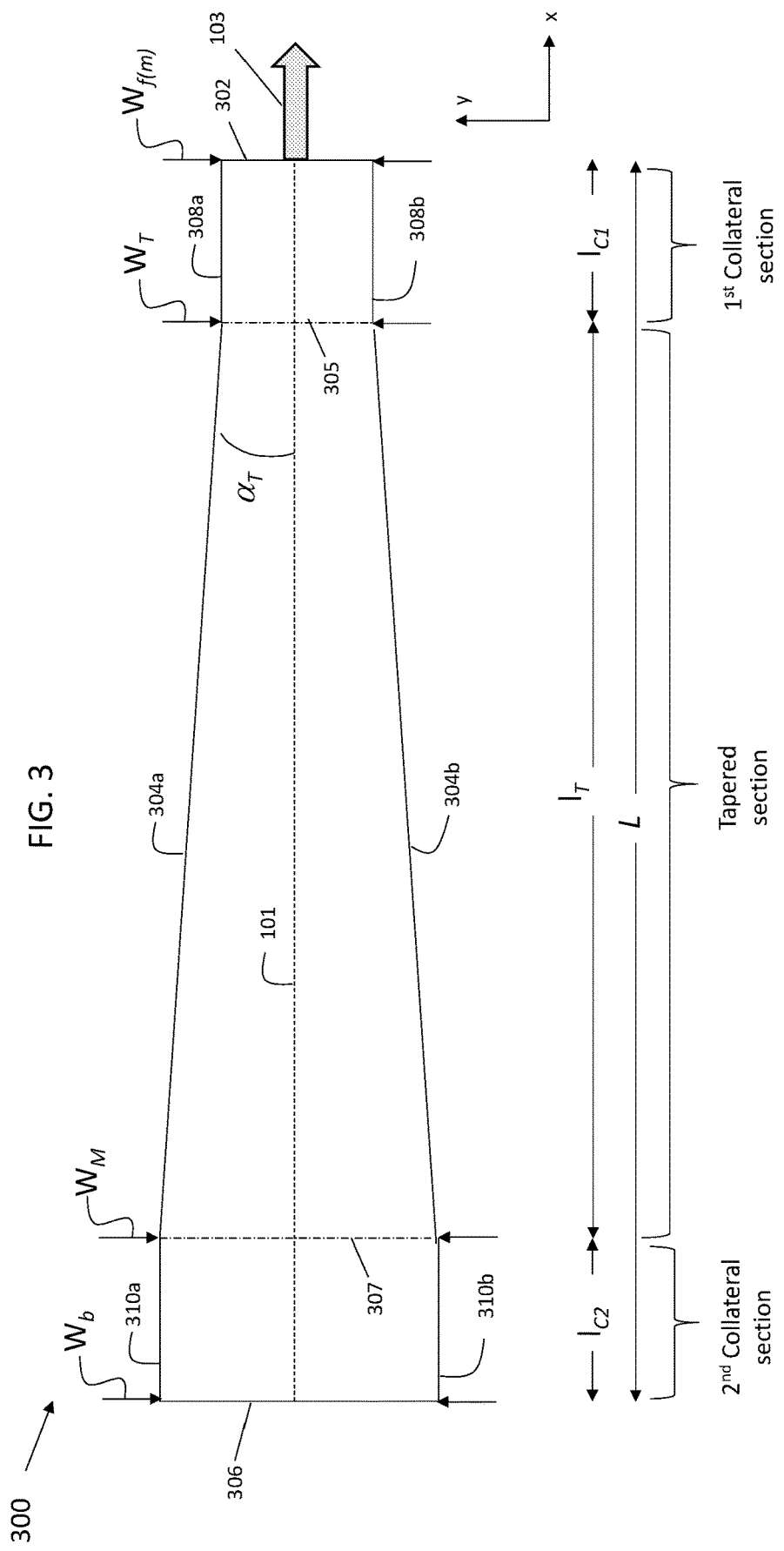
FIG. 3 shows a top down view of an illustrative tapered laser element formed as a linear ridge structure having a single tapered section bounded by two collateral sections.

FIG. 3 shows a top view of another illustrative laser element 300. The laser element 300 is also in the form of a linear ridge structure which is tapered having a front facet 302 and a back facet 306. However, the laser element 300 has three sections, a tapered section and two collateral sections. The first collateral section has the front facet 302 having a width w and parallel sides 308a, b extending away from the front facet 302 to a first face 305. In this embodiment, the diverging sides 304a, b of the tapered section extend away from the first face 305 to a maximum width $w_M$ at a second face 307 opposite the first face 305. The second collateral section has parallel sides 310a, b extending away from the second face 307 to the back facet 306 having a width $w_b$. In this embodiment, $w_M=w_b>w_f=w_T$. In this embodiment, the width $w_f$ of the front facet 302 (the lasing face) is also the minimum width $w_m$ in the linear ridge structure; the width $w_M$ is also the maximum width in the linear ridge structure. The diverging sides 304a, b may be straight (uncurved) or curved (e.g., parabolic). The length of the first collateral section is given by $l_{C1}$, the length of the tapered section is given by $l_T$, the length of the second collateral section is given by $l_{C2}$, and the laser cavity length is given by $L=l_{C1}+l_T+l_{C2}$. As shown in FIG. 3, the laser element 300 is particularly useful as an edge-emitting embodiment.

Figure 4A:
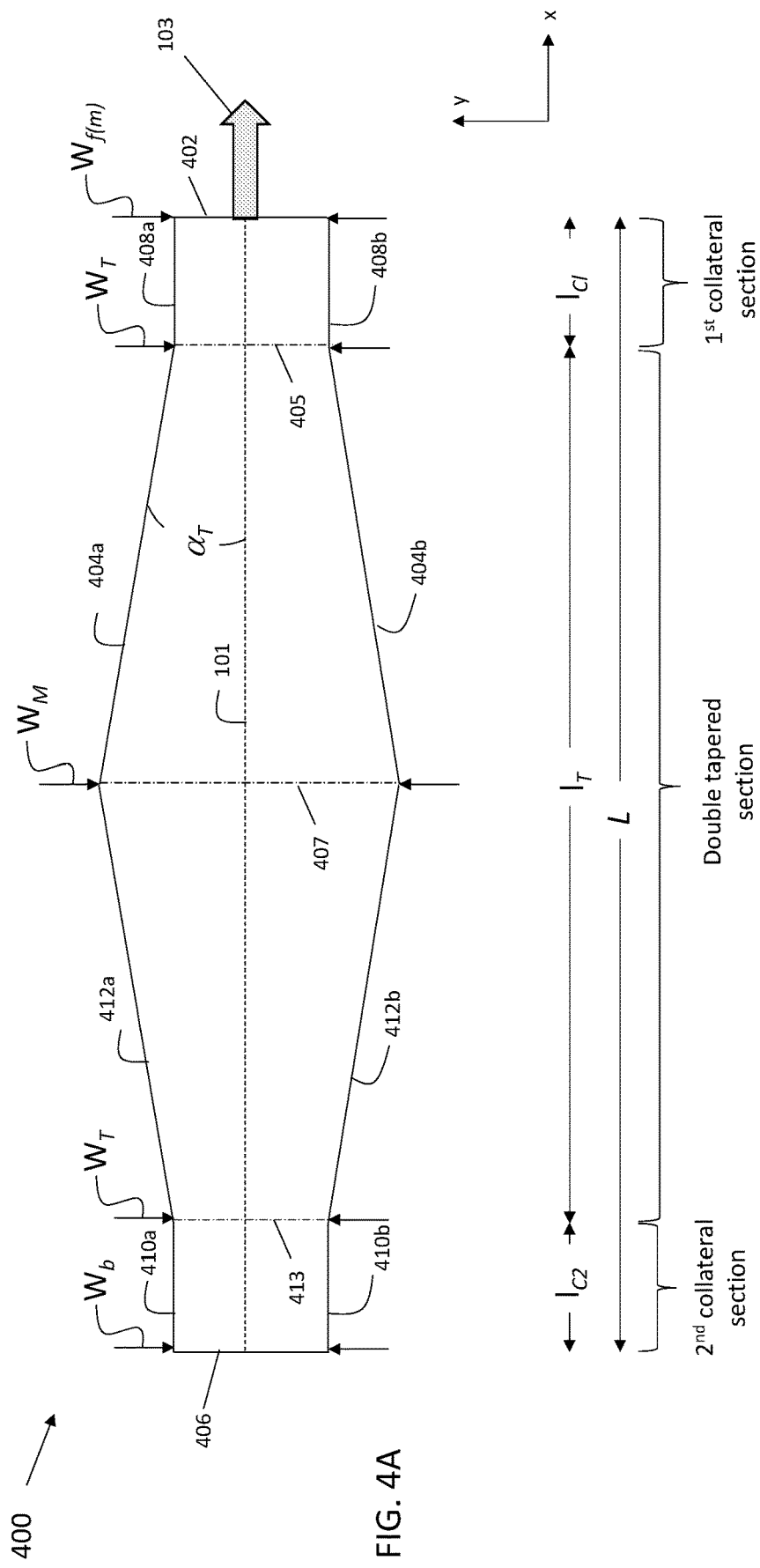
FIG. 4A shows a top down view of an illustrative tapered laser element formed as a linear ridge structure having a doubled tapered section bounded by two collateral sections.

FIG. 4A shows a top view of another illustrative laser element 400. The laser element 400 is also in the form of a linear ridge structure which is tapered having a front facet 402 and a back facet 406, However, the laser element 400 has four sections, two tapered sections and two collateral sections. The adjacent tapered sections may also be referred to as a double tapered section. The first collateral section has the front facet 402 having a width $w_f$ and parallel sides 408a, b extending away from the front facet 402 to a first face 405. In this embodiment, diverging sides 404a, b of the first tapered section extend away from the first face 405 to a maximum width $w_M$ at a second face 407 opposite the first face 405. The second tapered section has sides 412a, b which extend away from the second face 407 and converge to a third face 413. The second collateral section has parallel sides 410a, b extending away from the third face 413 to the back facet 406 having a width $w_b$.

In this embodiment, the laser element 400 is symmetric (although asymmetric configurations may be used). That is, the third face 413 and the back facet 406 both have the same width ($w_T$ and $w_b$, respectively) as the first face 405 and the front facet 402 ($w_T$ and $w_f$, respectively). In this embodiment, the width $w_f$ of the front facet 402 (the lasing face) is also minimum width $w_m$ in the linear ridge structure; the width $w_M$ is also the maximum width in the linear ridge structure. The diverging sides 404a, b and the converging sides 412a, b may each be straight (uncurved) or curved (e.g., parabolic). The length of the first collateral section is given by $l_{C1}$, the length of the first tapered section is given by $l_{T1}$, the length of the second tapered section is given by $l_{T2}$ (or the double tapered section has a length $l_T=l_{T1}+l_{T2}$), the length of the second collateral section is given by $l_{C2}$, and the laser cavity length is given by $L(l_{C1}+l_T+l_{C2})$. As shown in FIG. 4A, the laser element 400 is particularly useful as an edge-emitting embodiment.

Figure 4B:
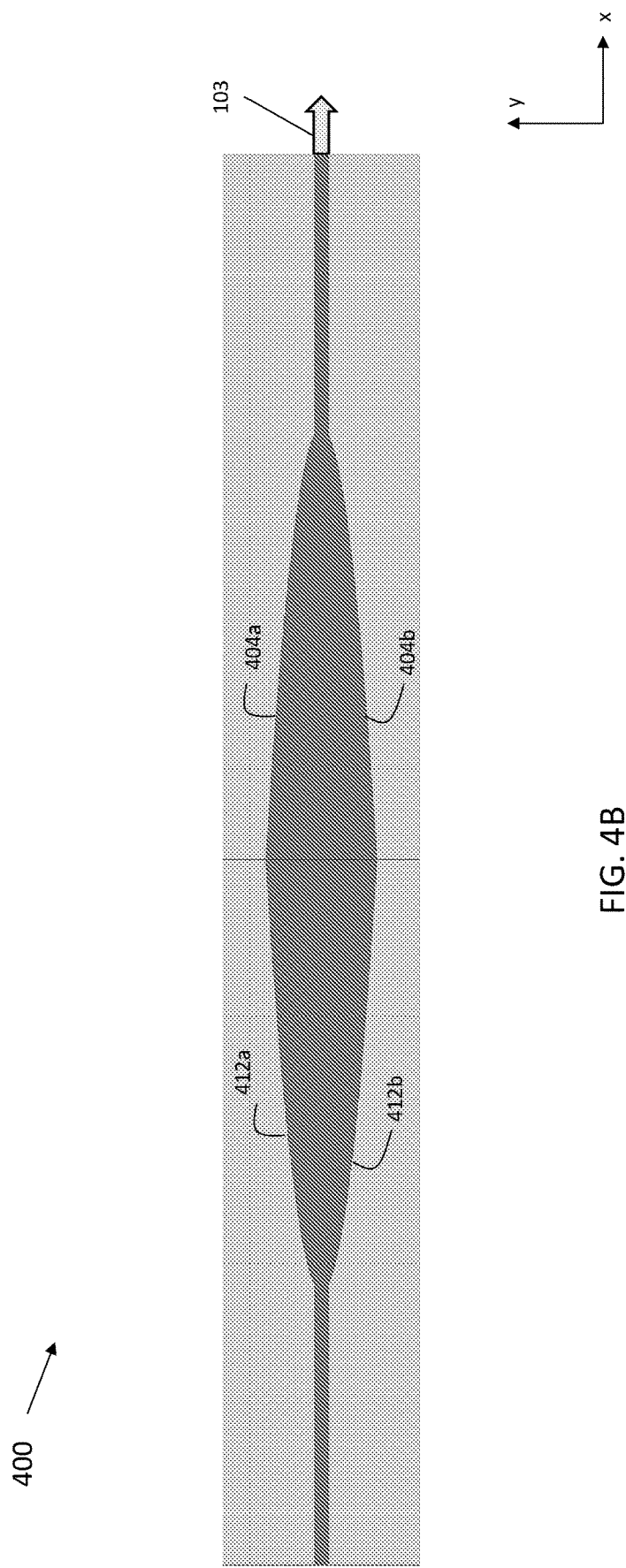
FIG. 4B shows a variation in which the sides of the double tapered section are curved (parabolic).

FIG. 4B shows a top view of a variation of the laser element 400 in which the diverging sides 404a, b and converging sides 412a, b of the two tapered sections are in the shape of parabolic curves.

Figure 5:
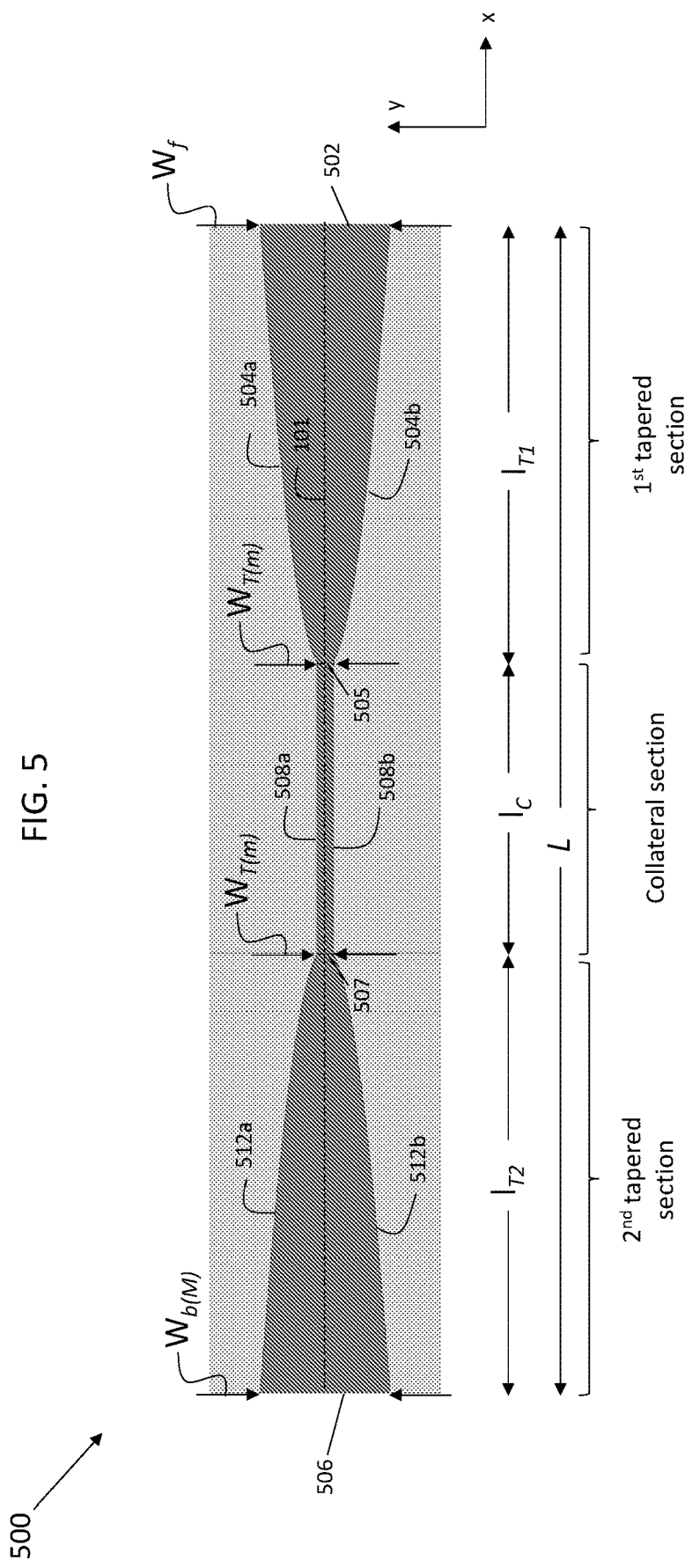
FIG. 5 shows a top down view of an illustrative tapered laser element formed as a linear ridge structure having a single collateral section bounded by two tapered sections.

FIG. 5 shows a top view of another illustrative laser element 500 which is particularly useful as a surface-emitting embodiment. The laser element 500 is also in the form of a linear ridge structure which is tapered having a front face 502 and a back face 506. The laser element 500 has three sections, two tapered sections and a collateral section. The first tapered section has the front face 502 having a width w and sides 504a, b extending away from the front face 502 and converging to a first face 505 having a width $w_T$. The collateral section has parallel sides 508a, b extending away from the first face 505 to a second face 507 opposite the first face 505. The second tapered section has diverging sides 512a, b which extend away from the second face 507 to the back face 506. The diverging sides 512a, b extend to a maximum width $w_M$, which in this embodiment, also corresponds to the width of the back face 506 ($w_b$).

In this embodiment, the laser element 500 is symmetric (although asymmetric configurations may be used). That is, the front facet 502 and the back facet 506 have the same width, (i.e., $w_f=w_b=w_M$), which is also the maximum width in the linear ridge structure. The first face 505 and the second face 507 also have the same widths, $w_T$, which, in this embodiment is also the minimum width $w_m$ in the linear ridge structure. This width $w_T$ also defines the widths of a portion of upper and lower faces (not labeled) perpendicular to front and back facets 502, 506 and first and second faces 505, 507. As noted above, for surface-emitting embodiments, the upper or lower faces correspond to the lasing face. Thus, the width of the lasing face varies across the laser element 500, in this embodiment, from $w_M$ at the front facet 502, to $w_T$ at the first and second faces 505, 507, and back to $w_M$ at the back facet 506.

Converging sides 504a, b and the diverging sides 512a, b are curved (parabolic), but they may each be straight (uncurved). The length of the collateral section is given by $l_C$, the length of the first tapered section is given by $l_{T1}$, the length of the second tapered section is given by $l_{T2}$, and the laser cavity length is given by $L(l_{T1}+l_C+l_{T2})$. As noted above, the laser element 500 is surface-emitting.

Other embodiments based on modifications to the laser element 500 of FIG. 5 may be used. By way of illustration, in some embodiments, the collateral section may be omitted and the first and second tapered sections may be adjacent to one another such that first and second faces 505, 507 are coincident.

As further described below, it is desirable that laser elements such as that shown in FIG. 5 include a DFB grating bounded by DBR gratings. Such a configuration provides control over reflections so as to controllably obtain the desired/designed mode.

Figure 6:
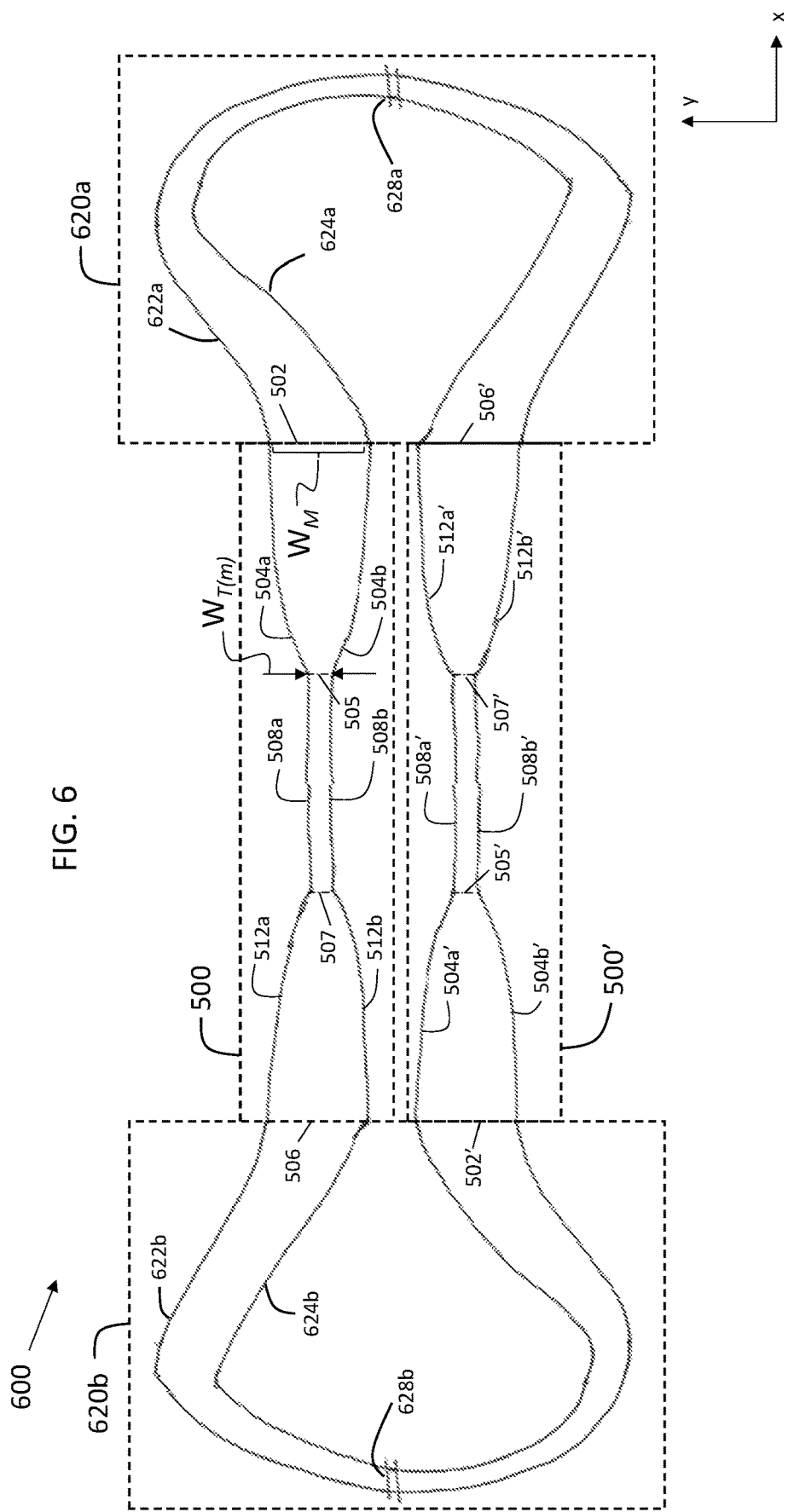
FIG. 6 shows a top down view of an illustrative tapered laser element formed as a continuous ridge structure.

FIG. 6 shows a top view of another illustrative laser element 600 which may be used to provide a surface-emitting QCL device. In this embodiment, the laser element 600 is in the form of a ridge structure which is continuous (as opposed to the linear ridge structures of FIGS. 1-5). As noted above, continuous ridge structures may also be referred to as "race track" configurations. In such configurations, front faces and back faces within the structures are optically coupled/connected via a connecting portion(s) so as to form a waveguide of equivalent "infinite" length.

In this particular embodiment, the laser element 600 has a first central portion 500 similar (or identical to) the laser element 500 of FIG. 5 and a second central portion 500' also similar (or identical to) the laser element 500 of FIG. 5. Connecting portions 620a and 620b optically couple the first and second central portions to one another. Specifically, connecting portion 620a has outer 622a and inner 624a sides which extend away from the front face 502 (analogous to the front facet 502 in FIG. 5) of the first central portion 500 to the back face 506' (analogous to the back facet 506 in FIG. 5) of the second central portion 500'. Similarly, connecting portion 620b has outer 622b and inner 624b sides which extend away from the back face 506 of the first central portion 500 to the front face 502' of the second central portion 500'. In this way, front and back faces 502, 506 of the first central portion 500 are effectively optically coupled to one another (as well as to front and back faces 502', 506' of the second central portion 500') so as to form a waveguide of equivalent infinite length. The dimensions and curvature of outer 622a, b and inner 624a, b sides as well as the overall shape of the connecting portions 620a, b are selected to ensure equal (or approximately equal) light paths so as to result in no (or a negligible) phase difference as light travels around the connecting portions.

In the embodiment shown in FIG. 6, the laser element 600 is symmetric (although asymmetric configurations may be used). That is, the front faces 502, 502' and the back faces 506, 506' have the same widths (i.e., $w_M$), which, in this embodiment, is the maximum width in the continuous ridge structure. The first faces 505, 505' and the second faces 507, 507' also have the same widths (i.e., $w_T$), wherein $w_T < w_M$. The width of the lasing face varies across the laser element 600 as described above with respect to the laser element 500. Moreover, laser emission may also exit from the connecting portions 620a, b. Converging sides 504a, b and 504a', b' and diverging sides 512a, b and 512a', b' are curved (e.g., parabolic), but they may each be straight (uncurved).

As noted above, laser elements in the form of continuous ridge structures are surface-emitting. As further described below, such laser elements comprise a DFB grating or DFB/DBR gratings, which may be configured as described in U.S. Pat. No. 9,093,821, which is incorporated by reference in its entirety. The use of DBR gratings in addition to the DFB gratings is useful to minimize heating. As shown in FIG. 6 and further described below, the DFB grating or the DFB/DBR gratings of laser elements in the form of continuous ridge structures also comprise a π phase-shifting region(s) (e.g., 628a, b).

It is to be understood that FIGS. 1-6 represent illustrative embodiments only. Other tapered ridge structure configurations (whether continuous or linear) involving various numbers of tapered sections, collateral sections, and relative arrangements of each section may be used. Moreover, as shown in the Examples below, the particular configuration of the tapered ridge structure (e.g., number of tapered/collateral sections, dimensions of tapered/collateral sections, and relative arrangements of tapered/collateral sections) are adjusted to ensure that the laser emission has a single-lobe, far-field beam pattern while also achieving a desired (e.g., maximum) output power. It has been found that output powers of at least about a factor of two as compared to existing single-mode QCL laser devices can be achieved. In general, minimum widths (including widths $w_m$) of tapered ridge structures may be in the range of from 2 to 6 µm, 2 to 5 µm, 2 to 4 µm, or 3 µm. Maximum widths (including widths $w_M$ defining the maximum extension of tapered section(s)) of tapered ridge structures may be in the range of from 8 to 30 µm, 10 to 30 µm, or 10 to 20 µm. Lengths of the collateral sections of tapered ridge structures may be in the range of from 0.25 mm to 5 mm, 0.5 to 4 mm, or 0.5 to 3 mm. Lengths of tapered sections may be in the range of from 2 mm to 7 mm, 3 mm to 7 mm, or 3 mm to 6 mm. Cavity lengths (for linear, tapered ridge structures) may be in the range of from 5 mm to 10 mm.

In addition, untapered ridge structures (whether linear or continuous) are also provided in which a DFB grating is used having a configuration that ensures that the laser emission has a single-lobe, far-field beam pattern while also achieving a desired (e.g., maximum) output power. Suitable DFB grating configurations are further described below. Widths of untapered ridge structures may be in the range of from 2 to 30 µm or 5 to 25 µm. Cavity lengths (for linear, untapered ridge structures) may be in the range of from 5 mm to 10 mm.

As noted above, the present laser elements are multilayer structures comprising multiple layers of semiconductor. Longitudinal cross-sectional views of illustrative laser elements are shown in FIGS. 7 and 8. For example, the longitudinal cross-sectional view would correspond to a cross-section taken along the dashed lines 101 of FIGS. 1-5 or taken along the center between sides of the laser element 600 of FIG. 6. Each laser element 700, 800 may be formed into any of the linear, tapered ridge structures described herein. Laser element 800 may also be formed into any of the linear, untapered ridge structures and any of the continuous, tapered or untapered ridge structures described herein.

Both laser elements 700 and 800 comprise a substrate 702, a quantum cascade active layer 704 over the substrate 702, an upper cladding layer 706a over the quantum cascade active layer 704, and a lower cladding layer 706b under the quantum cascade active layer 704.

Laser element 800 further comprises a DFB grating (and may comprise DBR grating sections) over the quantum cascade active layer 704. In this embodiment, the DFB grating is defined by an interface of a layer of metal 808 and a layer of semiconductor 810 underlying the layer of metal 808. The interface of the layer of metal 808 and the layer of semiconductor 810 is periodically corrugated in the longitudinal direction of the laser element 800 and is characterized by a periodicity $\Lambda_{DFB} = m\lambda/(2n_{eff})$, wherein m is the grating order, λ is the wavelength of the light generated by the quantum cascade active layer, and $n_{eff}$ is the effective index of refraction of the DFB/DBR grating for λ. The DFB grating may be second-order, wherein m=2. The DFB grating is also characterized by a grating depth (or grating height), labeled as 812 in FIG. 8, and a duty cycle, which is the percentage of metal in a grating period, labeled as 814. As further described below, the DFB grating is configured to ensure the single-lobe, far-field beam pattern, but this may be achieved either under symmetric-mode operation or antisymmetric-mode operation. The flexibility to adopt either symmetric- or antisymmetric-mode operation is particularly desirable as it has been found that symmetric-mode operation offers very high outcoupling efficiency while antisymmetric-mode operation offers large fabrication tolerances.

Regarding symmetric-mode operation, the DFB grating is configured to suppress one or more antisymmetric longitudinal modes so as to produce lasing in a symmetric longitudinal mode. That is, the duty cycle and grating depth of the DFB grating can be selected in order to achieve this suppression and lasing in only one symmetric longitudinal mode with laser emission characterized by a single-lobe, far-field beam pattern. Specifically, the guided optical mode of the laser element is coupled to antisymmetric plasmonic modes supported by the interface of the layer of metal and the layer of semiconductor forming the DFB grating. This generates one or more antisymmetric longitudinal modes. Under the appropriate values of the duty cycle and grating depth, this coupling is sufficient so as to result in absorption loss of the antisymmetric longitudinal modes to the DFB grating and to produce lasing in only one symmetric longitudinal mode. The laser emission will be characterized by the desired single-lobe beam pattern. Although the particular set of grating depth values and duty cycle values that allow for the suppression of one or more antisymmetric longitudinal modes so as to produce lasing in one symmetric longitudinal mode depends upon the desired wavelength of the laser emission, by way of illustration, the wavelength of the laser emission may be in a range of from 4 to 5 µm. The grating depth may be at least about 0.05 µm. This includes grating depths in a range of from 0.15 µm to 0.25 µm. The duty cycle may be less than 0.40, less than 0.35, or less than 0.30. This includes duty cycles in a range of from 0.20 to 0.35.

However, the inventors have found that other values of the duty cycle and grating depth of the DFB gratings may be used in order to achieve the opposite result, i.e., suppression of one or more symmetric longitudinal modes so as to produce lasing in an antisymmetric longitudinal mode. (See FIG. 16 showing results for an infinite-extent grating which has only one symmetric mode and one antisymmetric mode.) Specifically, the guided optical mode of the laser element is coupled to symmetric plasmonic modes supported by the interface of the layer of metal and the layer of semiconductor forming the DFB grating. This generates one or more symmetric longitudinal modes. Under the appropriate values of the duty cycle and grating depth, this coupling is sufficient so as to result in absorption loss of the symmetric longitudinal modes to the DFB grating and to produce lasing of an antisymmetric longitudinal mode. In such cases, the laser emission will be characterized by a double-lobed, far-field beam pattern instead of the desired single-lobe beam pattern. However, the single-lobe, far-field beam pattern may be recovered by incorporating a π phase-shifting region in the center of the longitudinal DFB grating. (See FIG. 15.)

Although the particular set of grating depth values and duty cycle values that allow for the suppression of one or more symmetric longitudinal modes so as to produce lasing in an antisymmetric longitudinal mode depends upon the desired wavelength of the laser emission, by way of illustration, the wavelength of the laser emission may be in a range of from 4 to 5 µm. The grating depth may be at least about 0.05 µm. This includes grating depths in a range of from 0.10 µm to 0.20 µm. The duty cycle may be greater than 0.45, greater than 0.50, or greater than 0.55. This includes duty cycles in a range of from 0.45 to 0.75.

The Examples below, illustrate selection of duty cycles for either symmetric- or antisymmetric-mode operation and the resulting effect on the outcoupling efficiency and fabrication tolerances.

Therefore, in addition to the embodiments described above for FIGS. 1-6, variations are encompassed which may be based on the laser element 800 comprising the DFB grating and configured for either symmetric- or antisymmetric-mode operation. (See also laser element 1500 of FIG. 15.) In embodiments, the laser element is a linear, untapered, surface-emitting ridge structure comprising a collateral section having parallel sides between a front face and a back face. This linear, untapered, surface-emitting ridge structure further comprises a DFB grating configured to suppress one or more longitudinal modes so as to produce lasing in an antisymmetric longitudinal mode. The DFB grating further comprises a π phase-shifting region.

In other embodiments, the laser element is a continuous, untapered, surface-emitting ridge structure. This continuous, untapered, surface-emitting ridge structure further comprises a collateral section having parallel sides between a front face and a back face and a first connecting portion having outer and inner sides, both of which extend away from the back face and towards the front face, the first connecting portion configured to optically couple the front face to the back face. This continuous, untapered, surface-emitting ridge structure further comprises a DFB grating configured to suppress the antisymmetric longitudinal mode so as to produce lasing in the symmetric longitudinal mode. The DFB grating further comprises two π phase-shifting regions. Variations similar to those shown in FIG. 6 are encompassed, but without the tapered sections.

It is to be understood that any of the laser elements formed as linear ridge structures as disclosed herein may include a DFB/DBR grating and that such a DFB/DBR grating may be configured for either symmetric- or antisymmetric-mode operation. However, if antisymmetric-mode operation is adopted, the DFB grating desirably includes a central π phase-shifting region in order to ensure a single-lobe, far-field beam pattern, as noted above. Any of the laser elements formed as continuous ridge structures as disclosed herein include a DFB or DFB/DBR grating and that such a DFB/DBR grating may be configured for either symmetric- or antisymmetric-mode operation. As shown in FIG. 6 and noted above, the DFB grating or the DBR parts of a DFB/DBR grating also include central π phase-shifting regions (i.e., 628a, b) to ensure that the optical modes in the first and second central portions 500, 500' are in-phase with each other and thus, constructively interfere. Other than these design criteria, other DFB/DBR gratings may be used in the present laser elements.

Figure 14:
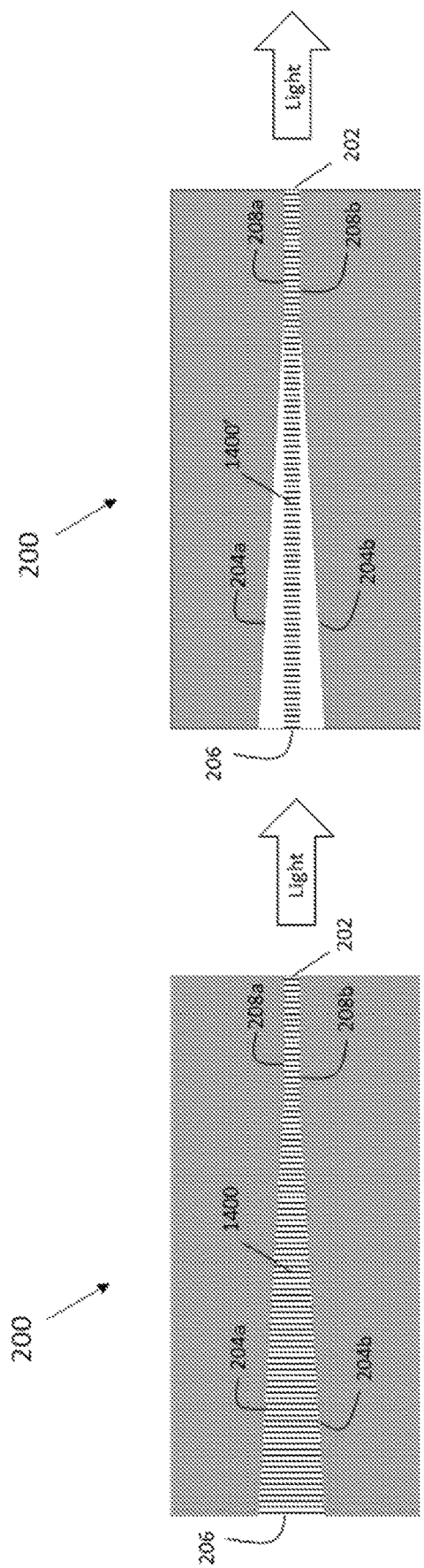
FIG. 14A shows a top down view of the tapered laser element of FIG. 2 but including an unpatterned DFB grating.
FIG. 14B shows a top down view of the tapered laser element of FIG. 2 but including a patterned DFB grating.

Regarding edge-emitting laser elements comprising a DFB/DBR grating, that grating can extend across the entire waveguide. Such gratings may be referred to as "full" or "unpatterned" gratings. An illustrative embodiment is shown in FIG. 14A showing the laser element 200 of FIG. 2, but including an unpatterned DFB grating 1400. The unpatterned DFB grating 1400 extends across the entire longitudinal length of the laser element from the front facet 202 to the back facet 206 as well as well as from the sides 208a, 204a to 208b, 204b, respectively. Unpatterned DFB gratings such as 1400 provide wavelength control, i.e., promotes lasing at a specific wavelength defined by the grating period of the grating. In other embodiments, the DFB is patterned so that it only partially extends across the waveguide. An illustrative embodiment is shown in FIG. 14B showing the laser element 200 of FIG. 2, but including a patterned DFB grating 1400. The patterned DFB grating 1400' does not fully extend from the sides 204a to 204b. However, it does extend across the entire longitudinal length of the laser element 200 and from the sides 208a to 208b. Patterned DFB gratings such as 1400' achieve both wavelength control as well as additional spatial mode control, i.e., additional, preferential feedback for the fundamental spatial mode. The phrase "DFB grating" and the like as used herein encompassed both unpatterned and patterned DFB gratings.

The present laser elements/devices may comprise additional layers typically used in semiconductor QCL lasers or otherwise desirable for optimal operation. By way of example only, such additional layers include a buffer layer between the substrate and the lower cladding layer in order to provide a suitable growth template. As another example, an optical confinement layer between the quantum cascade active layer and the lower cladding layer and an optical confinement layer between the quantum cascade active layer and the upper cladding layer may be used. These optical confinement layers may have a refractive index value higher than the refractive indices of the cladding layers and the quantum cascade active layer. Stop-etch layers and contact layers may be used. Various semiconductors and thicknesses may be used for these additional layers of semiconductor.

The semiconductors used for the substrate, quantum cascade active layer, cladding layers and additional layers are typically group III/V alloys (e.g., binary, ternary, quaternary alloys), but the choice of group III/V alloy is not particularly limited. By way of example only, the semiconductor lasers may be GaAs-based or InP-based and the compositions of the semiconductor layers may be those that are appropriate for GaAs-based or InP-based systems. The semiconductors may be doped or undoped.

Depending upon the configuration of the quantum cascade active layer, the present laser elements/devices may emit laser light having a wavelength within a broad range of wavelengths. For example, the laser emission may be in the mid-infrared wavelength range (i.e., 3-20 µm). In some embodiments, the laser emission has a wavelength in the range of from 5 µm to 15 µm, from 3 µm to 4 µm, from 3 µm to 5 µm, from 3.5 µm to 5 µm, from 4 µm to 5 µm or from 4.5 µm to 5 µm. At these wavelengths, the present laser elements/devices may exhibit single-mode CW operation at output powers of at least 1 W, at least 2 W, at least 3 W, at least 4 W, at least 5 W, at least 7 W, at least 9 W, and at least 10 W.

Known methods may be used to form the semiconductor layers of the semiconductor laser elements/devices, e.g., metal-organic chemical vapor deposition (MOCVD) or molecular beam epitaxy (MBE). Known methods may be used to form distributed feedback gratings (e.g., a sequence of holographic interference patterning, wet chemical etching and e-beam evaporation of metal).

Unless otherwise indicated, the use of directional terms such as upper, lower, front, back, etc. are not necessarily intended to be limiting, but rather to provide a point of reference in the relevant structures.

EXAMPLES

Simulations of laser elements having configurations similar to those shown in FIGS. 1-5 and 15 were conducted. Simulations were performed by two methods: full-wave electromagnetic simulation using the COMSOL software package and coupled-mode analysis for large-index-step gratings. (See, R. Noll and S. Macomber, IEEE JQE, 26, 456 (1990) and N. Finger, W. Schrenk, and E. Gornik, IEEE Journal of Quantum Electronics, Vol. 36, No. 7, 780 (2000).)

Example 1

Simulations for laser elements having configurations similar to that shown in FIG. 3 were conducted. Each laser element was edge-emitting and the sides of the single tapered section were straight. The wavelength of the light generated by the quantum cascade active layer was 4.6 µm. Laser elements having various values for $w_M(w_b)$, $w_{f(m)}$ ($w_T$), $l_{C2}$, $l_T$, and $l_{C1}$ were simulated. In each case, the cavity length L was 5 mm.

The results are shown in Table 1. The first row of Table 1 corresponds to the results for a comparative untapered, rectangular laser element having a constant width of 5 µm and a cavity length of 5 mm. The sixth column (relative area) shows the area of each laser element relative to the comparative untapered laser element. The seventh (fundamental mode) and eighth ($1^{st}$ order mode) columns show the threshold gain computed for each mode. The mode with the lowest threshold gain is favored to lase. The last column is the difference between the $1^{st}$ order mode threshold gain and the fundamental mode threshold gain. The most suitable tapered laser elements are those which are closest to the threshold gain difference for the comparative untapered laser element (marked target).

TABLE 1

Results for a 5 mm-long Tapered Buried Heterostructure Having a Single Tapered Section (Straight) with Two Collateral Sections.

| $w_M$ (µm) | $w_{f(m)}$ (µm) | $l_{C2}$ (µm) | $l_{C1}$ (µm) | $\alpha_T$ (°) | Relative Area (vs 5 µm × 5 mm) | Fundamental mode $g_{th,\,loc}$ (cm$^{-1}$) | $1^{st}$-order mode $g_{th,\,loc}$ (cm$^{-1}$) | Difference in $g^{th,\,loc}$ (cm$^{-1}$) |
|---|---|---|---|---|---|---|---|---|
| 5 | 5 | — | — | 0 | 1.00 | 3.40 | 4.48 | 1.08 (target) |
| 10 | 4 | 1000 | 2000 | 0.0859 | 1.28 | 3.37 | 4.58 | 1.20 |
| 10 | 4 | 2000 | 2000 | 0.1719 | 1.40 | 3.35 | 4.55 | 1.20 |
| 12 | 3 | 500 | 500 | 0.0644 | 1.50 | 3.32 | 4.53 | 1.21 |
| 12 | 3 | 1000 | 500 | 0.0737 | 1.59 | 3.31 | 4.45 | 1.14 |
| 12 | 3 | 100 | 500 | 0.0586 | 1.43 | 3.33 | 4.69 | 1.35 |
| 12 | 3 | 2000 | 1000 | 0.1289 | 1.68 | 3.34 | 5.18 | 1.85 |
| 12 | 3 | 2000 | 2000 | 0.2578 | 1.50 | 3.43 | 6.16 | 2.73 |

Example 2

Simulations for laser elements having configurations similar to that shown in FIG. 2 were conducted. Each laser element was edge-emitting and the sides of the single tapered section were curved (parabolic). The parameter α is a constant as described in the Equation above. The wavelength of the light generated by the quantum cascade active layer was 4.6 μm. Laser elements having various values of $w_M(w_b)$, $w_{f(m)}(w_T)$, $l_C$, and $l_T$ were simulated. In each case, the cavity length L was 5 mm. The results are shown in Table 2. Again, the first row of each table corresponds to the results for a comparative untapered, rectangular laser element having a constant width of 5 μm and a cavity length of 5 mm. The most suitable tapered laser elements are those which are closest to the threshold gain difference for the comparative untapered laser element.

TABLE 2

Results for a 5 mm-long Tapered Buried Heterostructure Having a Single Tapered Section (Parabolic) with a Single Collateral Section.

| $w_M$ (μm) | $w_{f(m)}$ (μm) | $l_C$ (μm) | α | Max half-angle of taper (°) | Relative Area (vs 5 μm × 5 mm) | Fundamental mode $g_{th,\,loc}$ (cm$^{-1}$) | 1$^{st}$-order mode $g_{th,\,loc}$ (cm$^{-1}$) | Difference in $g_{th,\,loc}$ (cm$^{-1}$) |
|---|---|---|---|---|---|---|---|---|
| 5 | 5 | — | — | 0 | 1.00 | 3.40 | 4.48 | 1.08 (target) |
| 11.68 | 3 | 1000 | 0.01 | 0.1522 | 1.43 | 3.37 | 4.86 | 1.49 |
| 16.25 | 3 | 1000 | 0.02 | 0.3044 | 1.90 | 3.32 | 4.70 | 1.38 |
| 14.15 | 3 | 2000 | 0.02 | 0.3044 | 1.41 | 3.45 | 6.39 | 2.94 |
| 17.20 | 3 | 2000 | 0.03 | 0.4566 | 1.65 | 3.43 | 5.83 | 2.40 |

Example 3

Additional simulations for laser elements having configurations similar to that shown in FIG. 2 were conducted. The results are shown in Tables 3 and 4. The laser elements of Table 3 were buried heterostructures having a core surrounded laterally by several microns of Fe-doped InP. The laser elements of Table 4 were ridge waveguides having a core surrounded laterally by a relatively thinner silicon nitride dielectric layer (typically ~400 nm) with a metal contact layer above/around that. The dielectric provides electrical insulation and screens the optical mode so it does not penetrate to the metal contact layer.

Each laser element was edge-emitting and the sides of the single tapered section were curved (parabolic). The parameter α is a constant as described in the Equation above. The wavelength of the light generated by the quantum cascade active layer was 4.6 μm. Laser elements having various values of $w_M(w_b)$, $w_{f(m)}(w_T)$, $l_C$, and $l_T$ were simulated. In each case, the cavity length L was 7 mm. Again, the first row of each table corresponds to the results for a comparative untapered, rectangular laser element having a constant width of 5 μm and a cavity length of 7 mm.

The most suitable tapered laser elements are those which are closest to the threshold gain difference for the comparative untapered laser element.

TABLE 3

Results for a 7 mm-long Tapered Buried Heterostructure Having a Single Tapered Section (Parabolic) with a Single Collateral Section.

| $w_{f(m)}$ (μm) | $w_M$ (μm) | $l_C$ (μm) | α | Max half-angle of taper (°) | Relative Area (vs 5 μm × 7 mm) | Fundamental mode $g_{th,\,loc}$ (cm$^{-1}$) | 1$^{st}$-order mode $g_{th,\,loc}$ (cm$^{-1}$) | Difference in $g_{th,\,loc}$ (cm$^{-1}$) |
|---|---|---|---|---|---|---|---|---|
| 5 | 5 | — | — | 0.000 | 1.000 | 2.90 | 3.83 | 0.93 (target) |
| 3 | 12.35 | 1000 | 0.0075 | 0.1141 | 1.564 | 2.81 | 3.73 | 0.93 |
| 3 | 14.15 | 1000 | 0.01 | 0.1522 | 1.763 | 2.79 | 3.58 | 0.79 |
| 3 | 12.10 | 1250 | 0.0075 | 0.1141 | 1.498 | 2.86 | 4.30 | 1.44 |
| 3 | 13.87 | 1250 | 0.01 | 0.1522 | 1.684 | 2.81 | 3.81 | 1.00 |
| 3 | 19.38 | 1250 | 0.02 | 0.3044 | 2.274 | 2.79 | 3.61 | 0.83 |
| 3 | 13.58 | 1500 | 0.01 | 0.1522 | 1.608 | 2.83 | 3.89 | 1.06 |
| 3 | 18.96 | 1500 | 0.02 | 0.3044 | 2.158 | 2.80 | 3.82 | 1.02 |
| 3 | 18.54 | 1750 | 0.02 | 0.3044 | 2.046 | 2.82 | 3.97 | 1.16 |
| 3 | 17.66 | 2250 | 0.02 | 0.3044 | 1.830 | 2.85 | 4.31 | 1.45 |
| 3 | 20.96 | 2500 | 0.03 | 0.4566 | 2.043 | 2.87 | 4.48 | 1.61 |

TABLE 4

Results for a 7 mm-long Tapered Ridge Waveguide Structure Having a Single
Tapered Section (Parabolic) with a Single Collateral Section.

| $w_{f(m)}$ (μm) | $w_M$ (μm) | $l_C$ (μm) | α | Max half-angle of taper (°) | Relative Area (vs 5 μm × 7 mm) | Fundamental mode $g_{th,\ loc}$ (cm$^{-1}$) | 1$^{st}$-order mode $g_{th,\ loc}$ (cm$^{-1}$) | Difference in $g_{th,\ loc}$ (cm$^{-1}$) |
|---|---|---|---|---|---|---|---|---|
| 5 | 5 | — | — | 0.000 | 1.000 | 2.90 | 3.83 | 0.93 (target) |
| 3 | 12.35 | 1000 | 0.0075 | 0.1141 | 1.564 | 2.82 | 3.66 | 0.85 |
| 3 | 12.10 | 1250 | 0.0075 | 0.1141 | 1.498 | 2.87 | 3.92 | 1.04 |
| 3 | 11.85 | 1500 | 0.0075 | 0.1141 | 1.434 | 2.92 | 4.17 | 1.24 |
| 3 | 13.58 | 1500 | 0.01 | 0.1522 | 1.608 | 2.89 | 4.04 | 1.15 |
| 3 | 18.96 | 1500 | 0.02 | 0.3044 | 2.158 | 2.84 | 3.81 | 0.97 |
| 3 | 18.54 | 1750 | 0.02 | 0.3044 | 2.046 | 2.89 | 4.06 | 1.17 |
| 3 | 22.61 | 1750 | 0.03 | 0.4566 | 2.446 | 2.87 | 3.98 | 1.11 |
| 3 | 26.05 | 1750 | 0.04 | 0.6087 | 2.786 | 2.86 | 3.95 | 1.09 |
| 3 | 25.43 | 2000 | 0.04 | 0.6087 | 2.623 | 2.93 | 4.21 | 1.28 |

Example 4

Simulations for laser elements having configurations similar to that shown in FIG. 4B were conducted. Each laser element was edge-emitting and the sides of the double tapered section were curved (parabolic). The parameter α is a constant as described in the Equation above. The wavelength of the light generated by the quantum cascade active layer was 4.6 μm. Laser elements having various values of $w_{f(m)}(w_T, w_b)$, $w_M$, $l_{C1}(l_{C2})$, and $l_{T1}(l_{T2})$ were simulated. In each case, the cavity length L was 7 mm. The results are shown in Table 5. Again, the first row of Table 5 corresponds to the results for a comparative untapered, rectangular laser element having a constant width of 5 μm and a cavity length of 7 mm. The most suitable tapered laser elements are those which are closest to the threshold gain difference for the comparative untapered laser element.

TABLE 5

Results for a 7 mm-long Tapered Buried Heterostructure Having a
Double Tapered Section (Parabolic) and Two Collateral Sections.

| $w_{f(m)}$ (μm) | $w_M$ (μm) | $l_{C1} = l_{C2}$ (μm) | α | Max half-angle of taper (°) | Relative Area (vs 5 μm × 7 mm) | Fundamental mode $g_{th,\ loc}$ (cm$^{-1}$) | 1$^{st}$-order mode $g_{th,\ loc}$ (cm$^{-1}$) | Difference in $g_{th,\ loc}$ (cm$^{-1}$) |
|---|---|---|---|---|---|---|---|---|
| 5 | 5 | — | — | 0.0000 | 1.00 | 2.90 | 3.83 | 0.93 (target) |
| 3 | 10.23 | 500 | 0.01 | 0.1522 | 1.33 | 2.82 | 4.32 | 1.50 |
| 3 | 14.15 | 500 | 0.02 | 0.3044 | 1.76 | 2.80 | 3.74 | 0.94 |
| 3 | 9.83 | 750 | 0.01 | 0.1522 | 1.23 | 2.86 | 4.27 | 1.41 |
| 3 | 13.58 | 750 | 0.02 | 0.3044 | 1.61 | 2.81 | 4.05 | 1.24 |
| 3 | 16.49 | 750 | 0.03 | 0.4566 | 1.90 | 2.80 | 3.81 | 1.00 |
| 3 | 18.96 | 750 | 0.04 | 0.6087 | 2.16 | 2.79 | 3.73 | 0.94 |
| 3 | 18.10 | 1000 | 0.04 | 0.6087 | 1.94 | 2.83 | 4.77 | 1.94 |
| 3 | 16.25 | 1500 | 0.04 | 0.6087 | 1.53 | 2.91 | 5.49 | 2.58 |

Example 5

Simulations for laser elements formed as linear, untapered, surface-emitting ridge structures and including a DFB grating bounded by two DBR regions were conducted. The DFB grating was configured similar to that shown in FIG. 8 and various duty cycles were selected to show control over symmetric- and antisymmetric-mode operation as well as the effect on the outcoupling efficiency and fabrication tolerances. The DFB grating configured for antisymmetric-mode operation included a central π phase-shifting region. In each case, the laser cavity length was 5 mm.

Figure 9B:
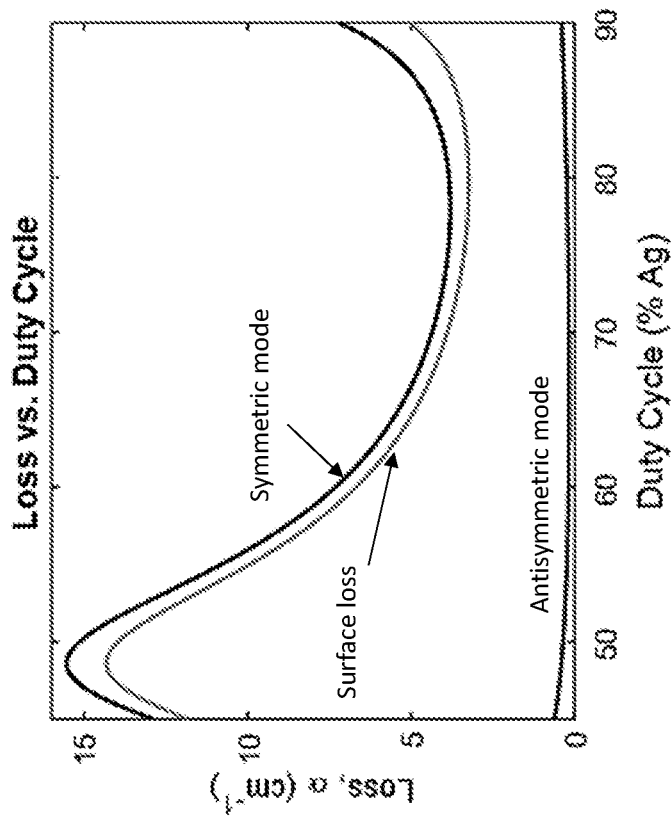
FIGS. 9A-9B show plots of loss versus duty cycle for the symmetric and antisymmetric longitudinal modes of illustrative, infinite-length laser elements which include a DFB grating.
Figure 9A:
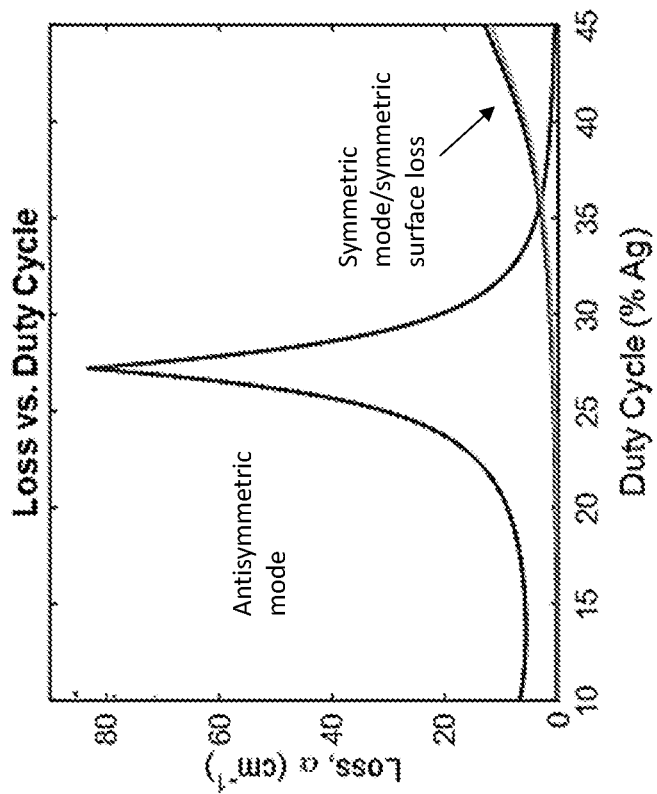
Figure 10A:
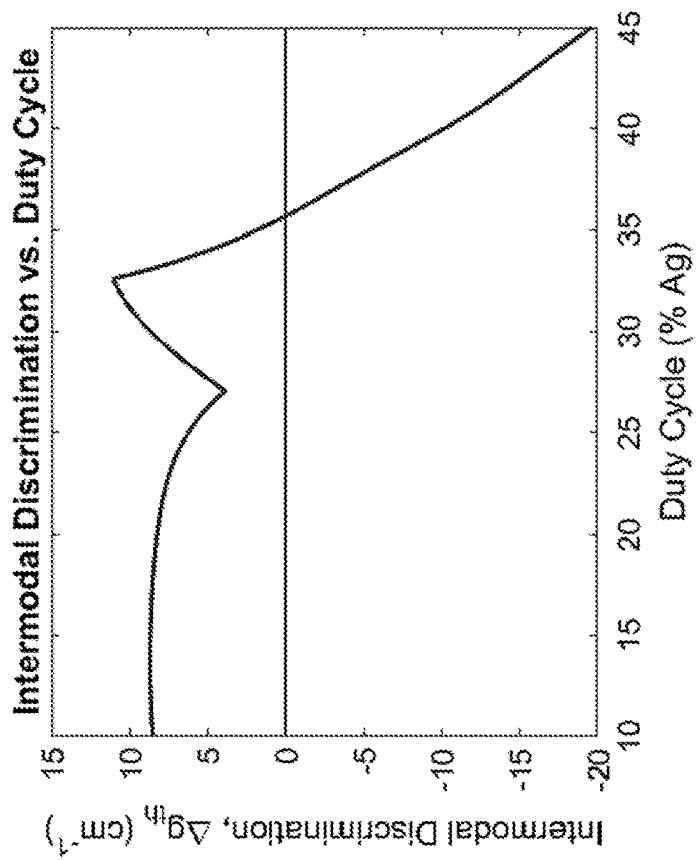
FIGS. 10A-10B demonstrate symmetric longitudinal mode behavior (low duty cycles) for an illustrative laser element including a DFB/DBR grating, including the effect of duty cycle on intermodal discrimination and outcoupling efficiency.
Figure 10B:
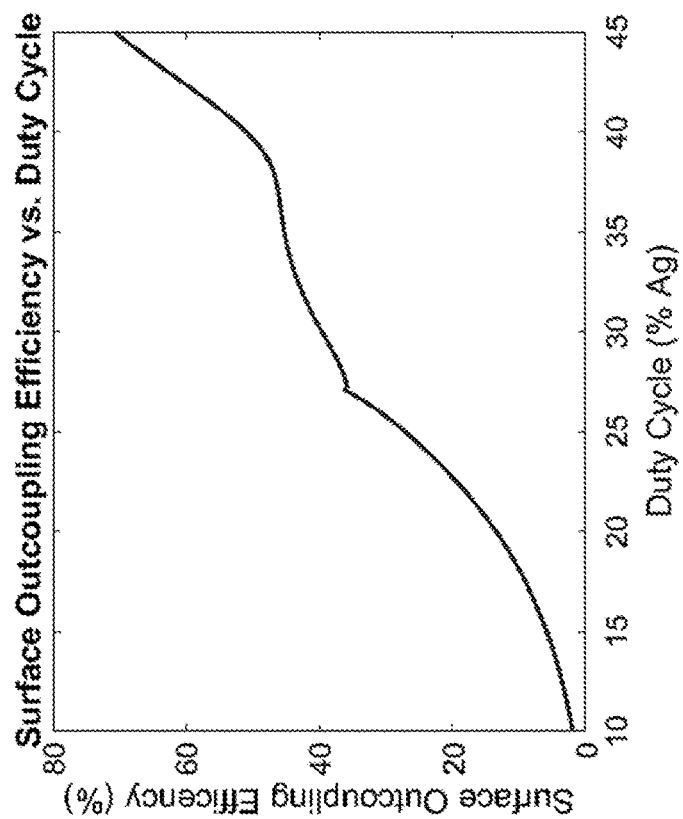
Figure 11B:
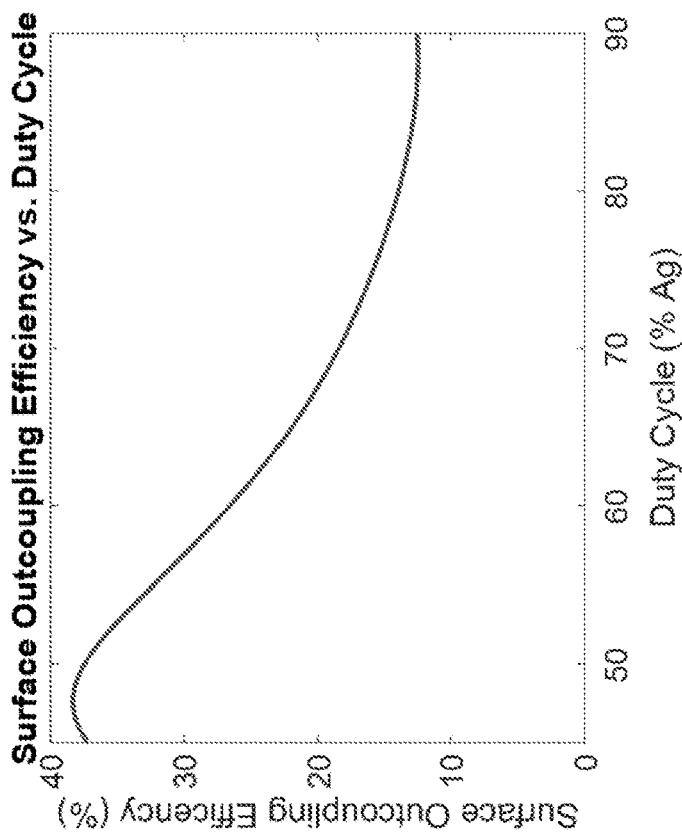
FIGS. 11A-11B demonstrate antisymmetric longitudinal mode behavior (high duty cycles) for an illustrative laser element including a DFB/DBR grating, including the effect of duty cycle on intermodal discrimination and outcoupling efficiency.
Figure 11A:
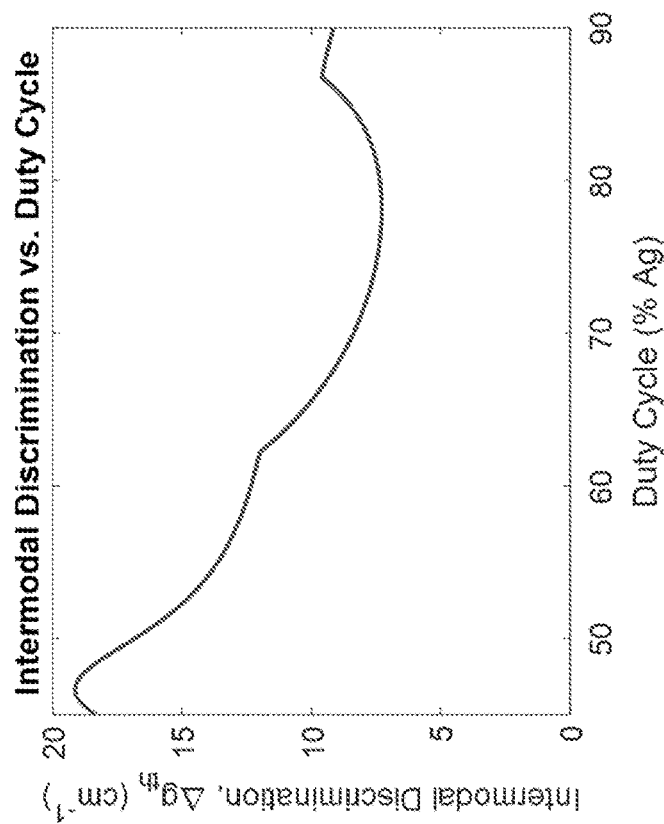

The results are shown in FIGS. 9A-11B. FIG. 9A shows that for low grating duty cycles (~27%), the antisymmetric (A)-mode is strongly lossy due to coupling to the metal/semiconductor plasmon wave of an infinite-length DFB grating, while the symmetric (S)-mode is not at all affected. The window of operation (tolerance) is relatively narrow at ~5% (i.e., between 25-30%). FIG. 9B shows that for high grating duty cycles (~50%) the S-mode of an infinite-length device is strongly lossy due to coupling to the metal/semiconductor plasmon wave, while the A-mode is not at all affected. The window of operation is much wider at ~15% (i.e., between 45-60%). FIGS. 10A-10B show the S-mode behavior of a 5 mm-long device for low grating duty cycles. Over the (narrow) window of operation the intermodal discrimination is small (5-10 cm$^{-1}$), while the outcoupling efficiency is high (~40%). FIGS. 11A-11B show the A-mode behavior of a 5 mm-long device for high grating duty cycles. Over the (wide) window of operation the intermodal discrimination is large (>10 cm$^{-1}$), while the outcoupling efficiency is moderate (28-38% and 33% on average).

Figure 12B:
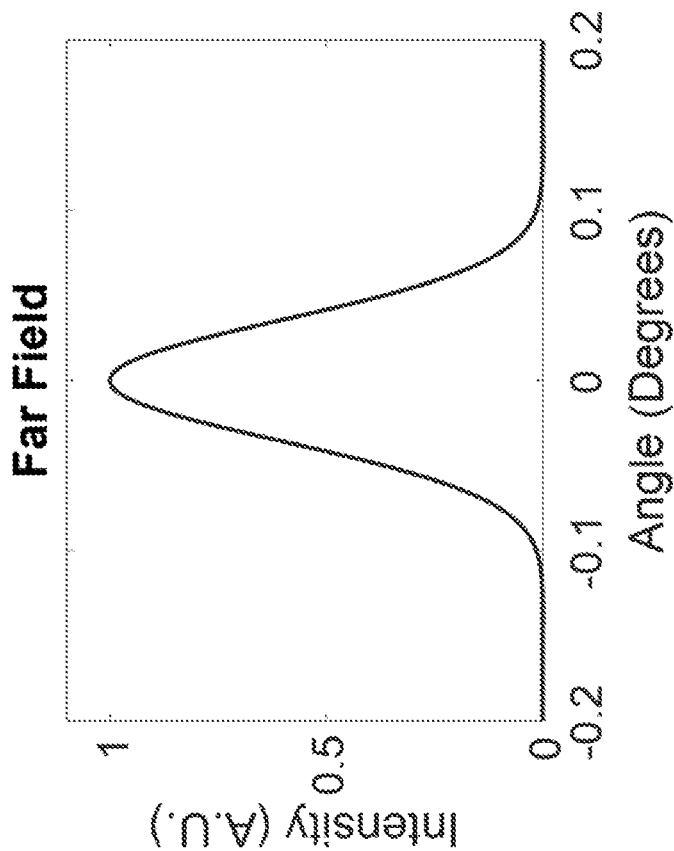
FIGS. 12A-12D show near-field and far-field beam patterns for an illustrative laser element having a DFB/DBR grating configured for symmetric mode operation (FIGS. 12A, 12B) and for an illustrative laser element having a DFB/DBR grating configured for antisymmetric mode operation (FIGS. 12C, 12D).
Figure 12A:
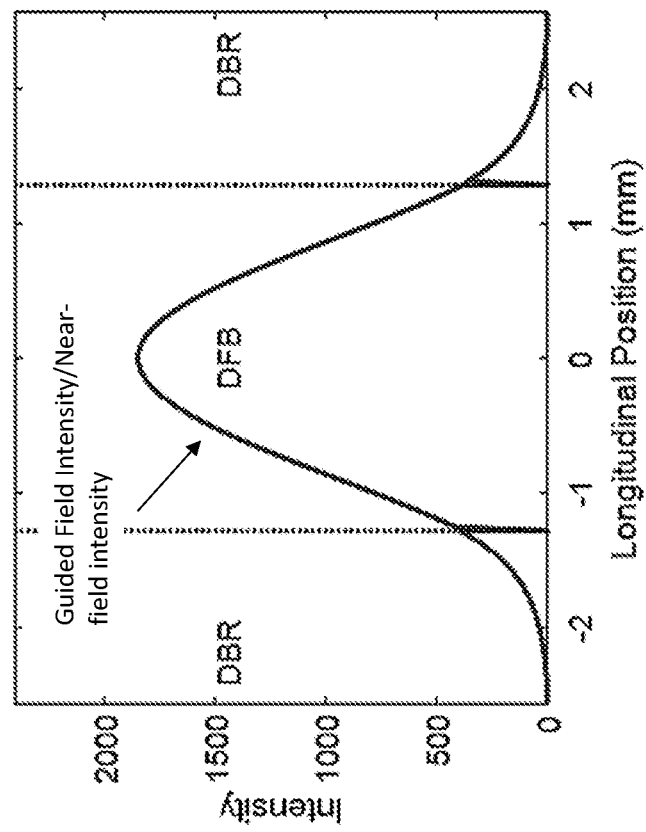
Figure 12D:
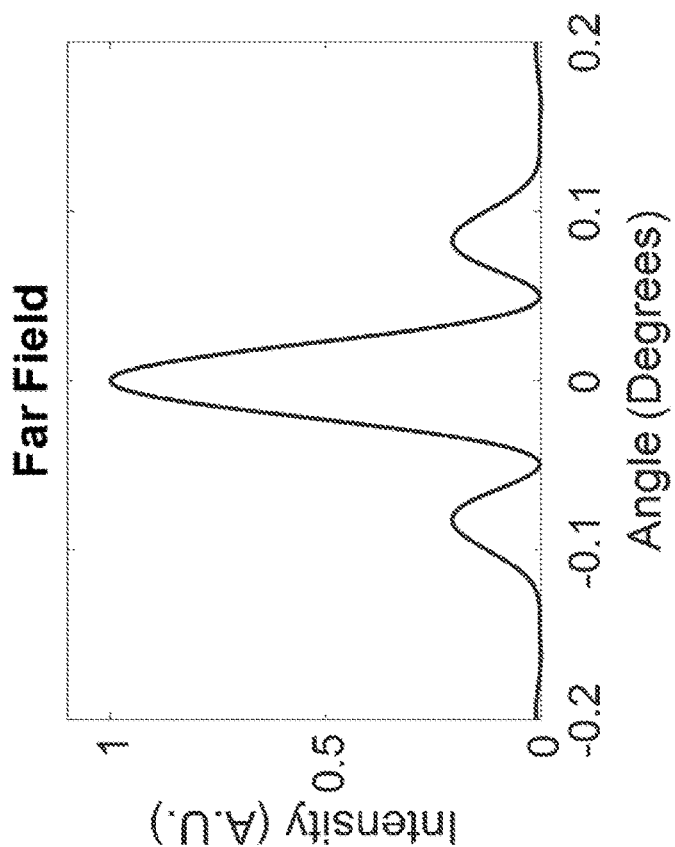
Figure 12C:
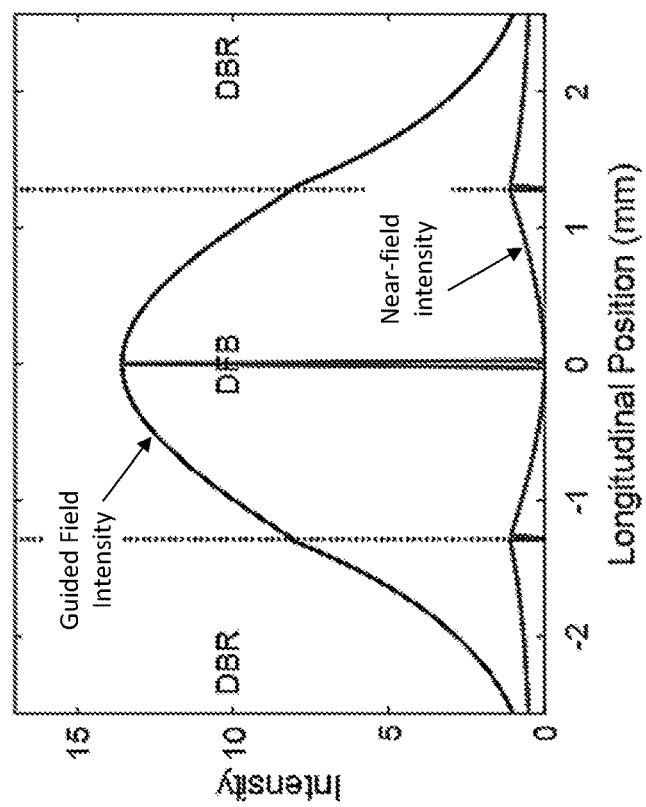

Finally, FIG. 12A shows the near-field and FIG. 12B shows the far-field beam patterns for a DFB/DBR grating configured for symmetric-mode operation (27.1% duty cycle), confirming the existence of the single-lobe, far-field beam pattern. FIGS. 12C-12D show similar results for a DFB/DBR grating configured for antisymmetric mode operation (50% duty cycle and including a central π phase-shifting region). Both are for 5 mm-long devices.

Example 6

This Example demonstrates 4.6 μm-emitting grating-coupled, surface-emitting (GCSE) quantum cascade lasers (QCLs) with a central π-phaseshift that are configured to solely operate in an antisymmetric mode for high continuous-wave (CW) output power, single-lobed beam operation, while maintaining strong intermodal discrimination over a wide range of grating duty cycles.

Figure 15:
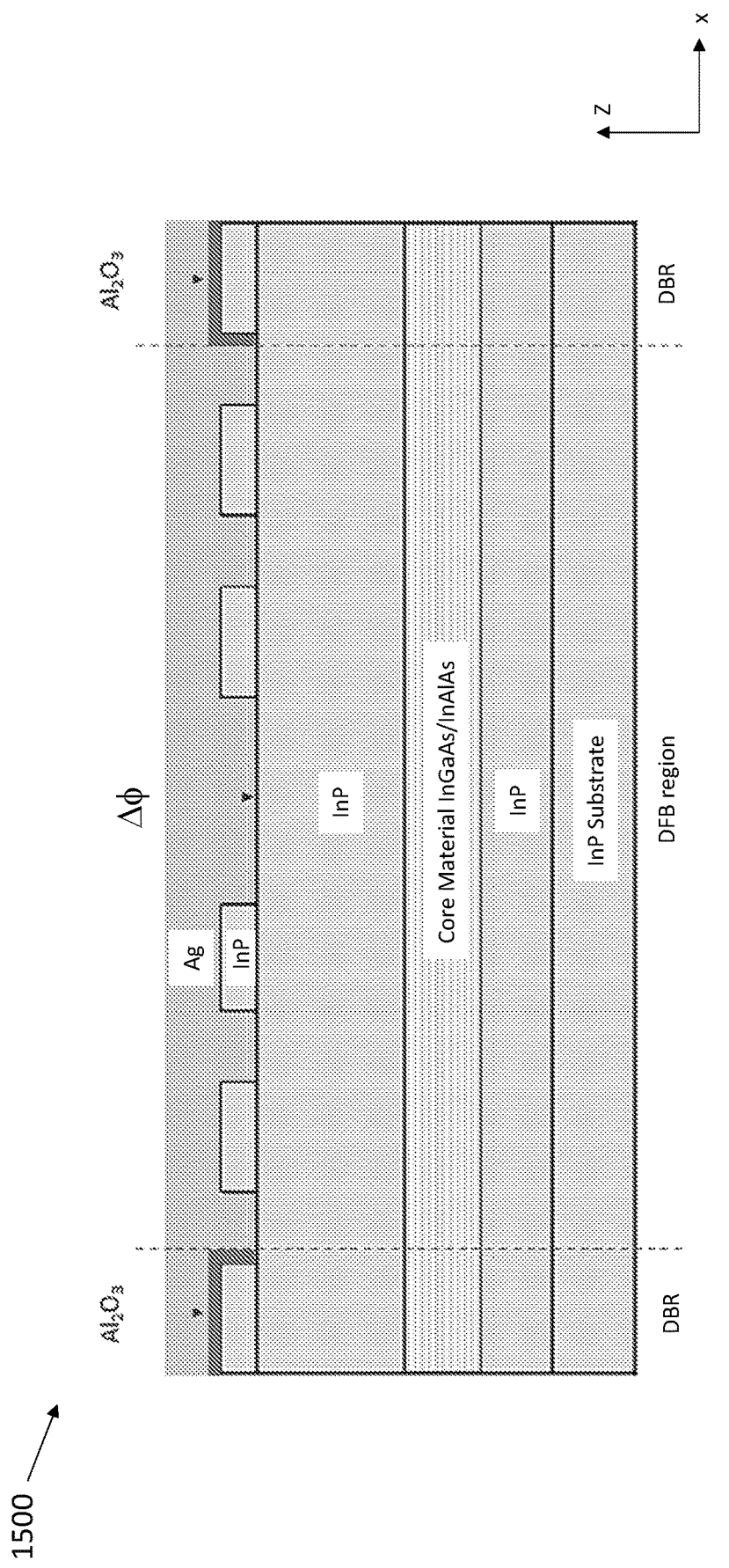
FIG. 15 shows a longitudinal cross-section of an illustrative laser element.
Figure 16:
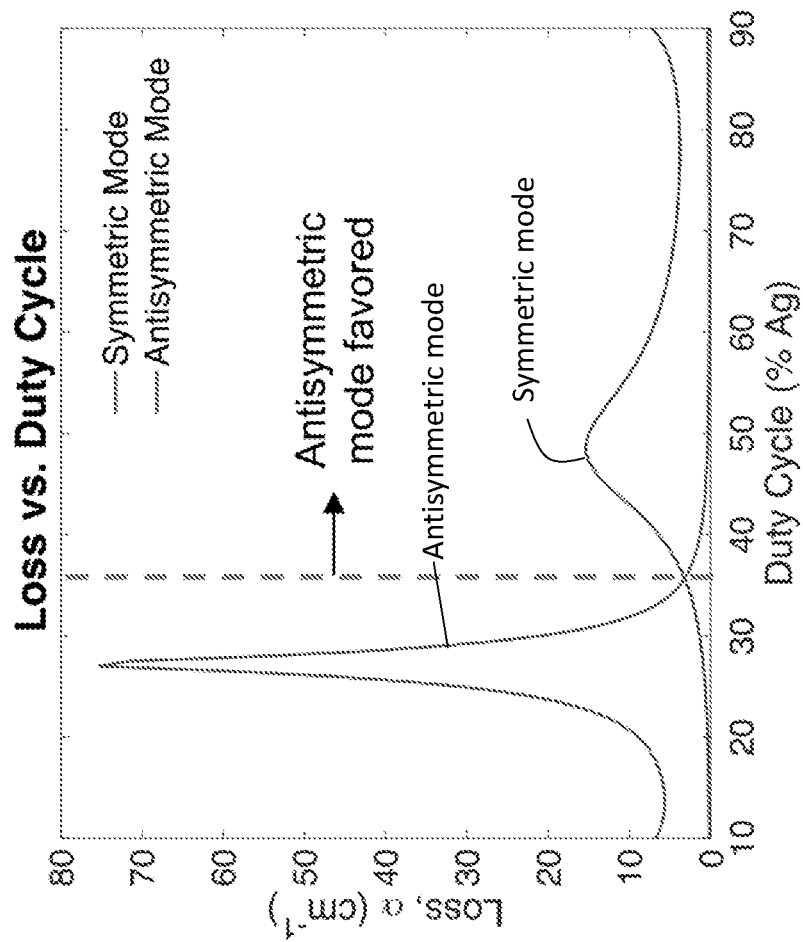
FIG. 16 shows losses of the symmetric and antisymmetric modes as a function of grating duty cycle for the laser element of FIG. 15.

A longitudinal cross-sectional view of the linear, untapered, surface-emitting ridge structure 1500 is shown in FIG. 15. A $2^{nd}$-order DFB/DBR metal (Ag)/semiconductor (InP) grating is used for feedback and outcoupling. A π phaseshift (Δϕ=π) is placed in the DFB-region center, in order for antisymmetric-mode devices to emit in a single-lobe beam pattern. FIG. 16 shows, for infinite-extent devices, that the favored mode can be selected based on the grating duty cycle (percentage of metal in a grating period). At lower duty cycles the antisymmetric mode is strongly absorbed due to resonant coupling of the guided light to the antisymmetric surface-plasmon modes of the $2^{nd}$-order grating, allowing symmetric-mode operation, but at higher duty cycles the antisymmetric mode is favored. Symmetric-mode devices and antisymmetric-mode devices with π-phaseshift each has its own distinct advantages and disadvantages.

Simulations were performed to optimize the waveguide geometry. Specifically, a 4D-parametric sweep varying the cladding thickness, grating height, duty cycle, and device length was carried out with COMSOL Multiphysics, followed by finite-length analysis and continuous-wave (CW) modeling. The optimum design for a 5 μm-wide ridge was found for each device type, based on CW output power and intermodal discrimination, in order to ensure single-mode operation. Two different DFB lengths ($L_{DFB}$) were investigated, including $L_{DFB}$=2.5 mm and 5 mm. The lengths of each DBR region ($L_{DBR}$) were 75% of $L_{DFB}$.

Figure 17B:
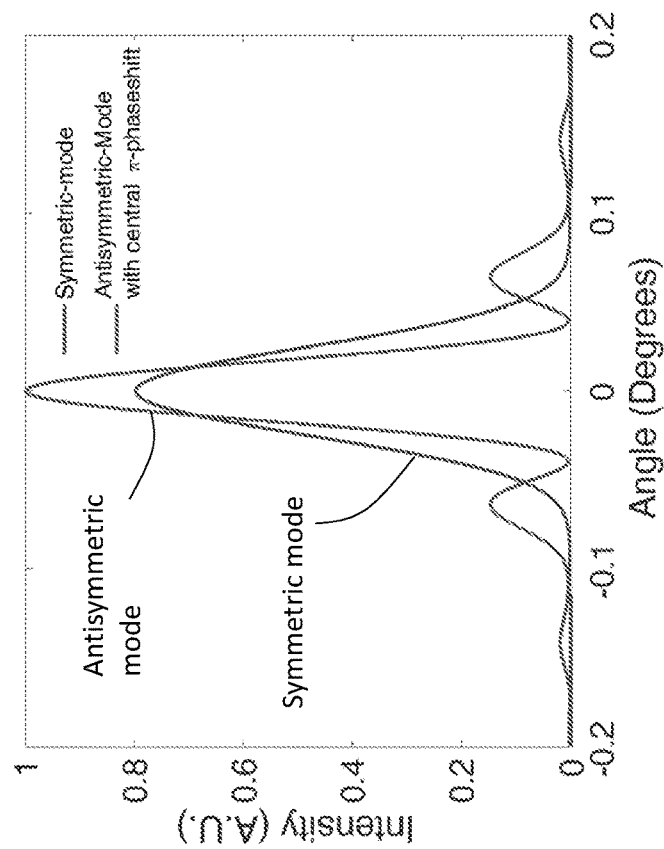
FIG. 17B shows the corresponding single-lobe, far-field beam patterns for laser elements having length of the DFB grating ($L_{DFB}$)=2.5 mm.
Figure 17A:
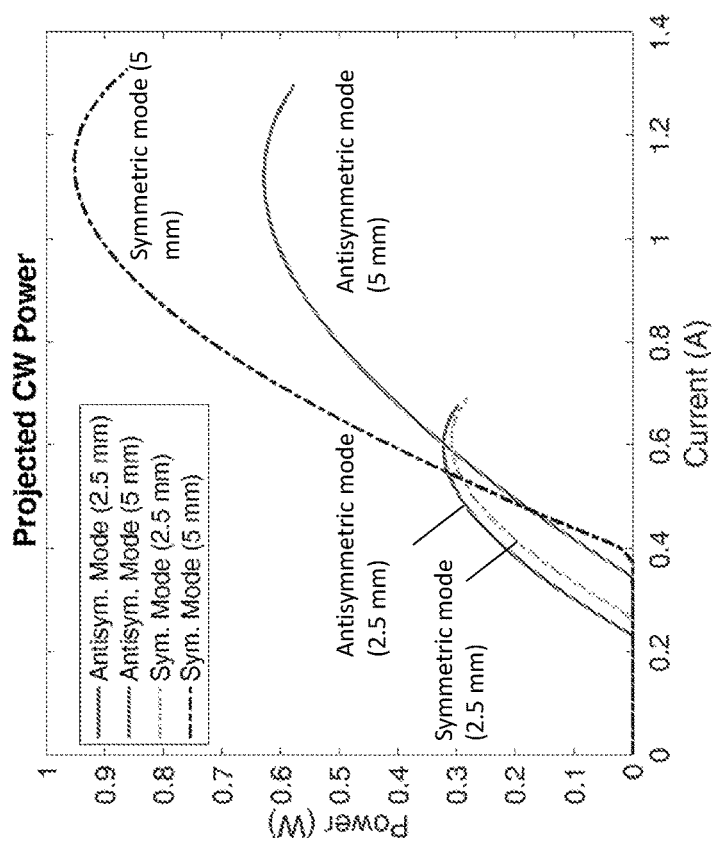
FIG. 17A shows continuous-wave (CW) power of laser elements according to FIG. 15.

The projected CW output powers of the optimized devices of varying $L_{DFB}$ are shown in FIG. 17A. For shorter lengths, the output powers of each device are comparable. However, the symmetric-mode device output power scales much more efficiently with device length, since as the length increases the device approaches the infinite-length case; that is, an infinite-length antisymmetric-mode GCSE device does not outcouple light. For $L_{DFB}$=5 mm, the CW output power is 0.95 W for the symmetric-mode device and 0.63 W for the antisymmetric-mode device. The beam patterns for these devices are shown in FIG. 17B. The symmetric-mode device has a single-lobed far field, while the antisymmetric-mode device far field has a narrower central lobe, although it also has negligible side lobes such that it is also considered to provide single-lobe emission.

Figures 18A, 18B:
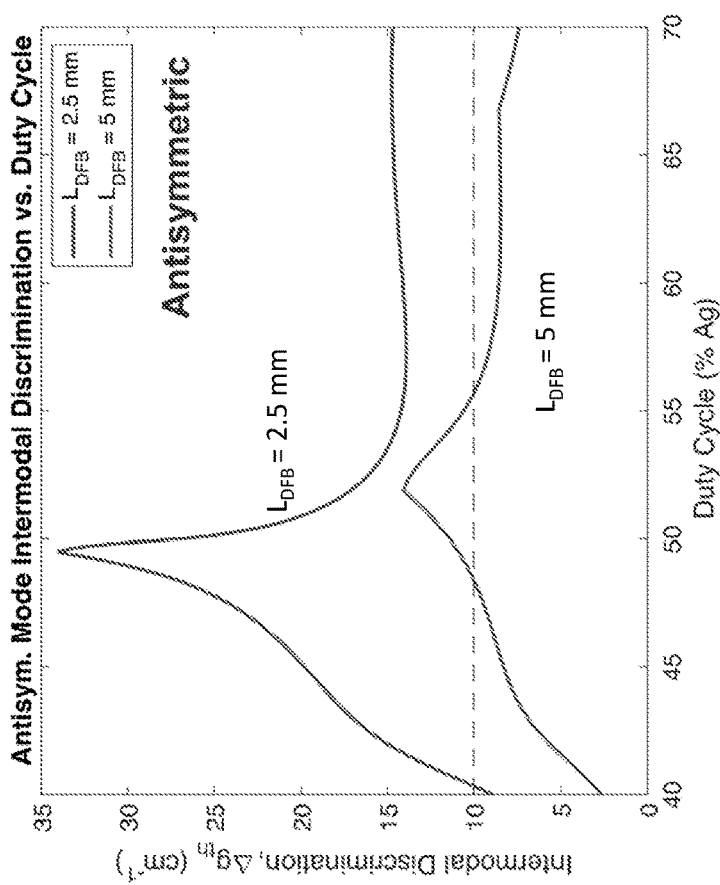
FIG. 18A shows intermodal discrimination as a function of the duty cycle for the antisymmetric-mode device of FIG. 15 with a $\pi$-phaseshift for $L_{DFB}$=2.5 mm and 5 mm.
FIG. 18B shows intermodal discrimination as a function of duty cycle for the symmetric-mode device for $L_{DFB}$=2.5 mm and 5 mm.

Key advantages that antisymmetric-mode devices hold over symmetric-mode devices are a significantly larger tolerance for fabrication errors, and a higher intermodal discrimination. This is shown in FIGS. 18A-B. The duty-cycle window for 10 cm$^{-1}$ intermodal discrimination is significantly wider for the antisymmetric-mode device (e.g., 7.3% vs. no window, when $L_{DFB}$=5 mm) and the intermodal discrimination is also much higher. While the maximum CW output power and the beam pattern of the symmetric-mode device are more desirable, the antisymmetric-mode device with π-phaseshift offers an attractive alternative for a single-lobed GCSE QCL with large tolerance for fabrication errors.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the disclosure has been presented for purposes of illustration and of description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and as practical applications of the disclosure to enable one skilled in the art to utilize the disclosure in various embodiments and with various modifications as suited to the particular use contemplated. It is intended that the scope of the disclosure be defined by the claims appended hereto and their equivalents.

What is claimed is:

1. A single-mode quantum cascade semiconductor laser comprising a laser element, the laser element comprising:
    (a) a quantum cascade active layer;
    (b) an upper cladding layer over the quantum cascade active layer; and
    (c) a lower cladding layer under the quantum cascade active layer, wherein the quantum cascade active layer, the upper cladding layer and the lower cladding layer define a guided optical mode;
    wherein the quantum cascade active layer and the upper and lower cladding layers are shaped in the form of a ridge structure having a front face, a back face opposite the front face, and a lasing face through which laser emission exits the ridge structure, the ridge structure configured such that the laser emission has a single-lobe, far-field beam pattern from the ridge structure comprising:
    (1) a tapered section having diverging sides between the front face and the back face which diverge away from one another and towards the back face to define a maximum width $w_M$, wherein the lasing face has a width $w_m$ and $w_M > w_m$, and the ridge structure is edge-emitting; or
    (2) a tapered section having diverging sides between the front face and the back face which diverge away from one another and towards the back face to define a maximum width $w_M$, the ridge structure further comprising a distributed feedback grating and a first face having a width $w_m$ between the front face and the back face wherein $w_M > w_m$, and the ridge structure is surface-emitting having the lasing face perpendicular to the front, the back, and the first faces; or
    (3) a collateral section having parallel sides between the front face and the back face, the ridge structure further comprising a distributed feedback grating configured to suppress one or more symmetric longitudinal modes so as to produce lasing in an antisymmetric longitudinal mode, the distributed feedback grating further configured so that the laser emission from the ridge structure has the single-lobe, far-field beam pattern, wherein the ridge structure is surface-emitting having the lasing face perpendicular to the front and the back faces; or
    (4) a collateral section having parallel sides between the front face and the back face and a first connecting portion having outer and inner sides, both of which extend away from the back face and towards the front face, the first connecting portion configured to optically couple the front face to the back face, the ridge structure further comprising a distributed feedback grating configured to suppress an antisymmetric longitudinal mode so as to produce lasing in a symmetric longitudinal mode, the distributed feedback grating further configured so that the laser emission from the ridge structure has the single-lobe, far-field beam pattern, wherein the ridge structure is continuous and surface-emitting having the lasing face perpendicular to the front and the back faces.

2. The laser of claim 1, wherein the ridge structure comprises (1) or (2) and wherein the width $w_M$ is the largest width across the ridge structure.

3. The laser of claim 1, wherein the ridge structure comprises (1) or (2) and wherein the width $w_m$ is the smallest width across the ridge structure.

4. The laser of claim 1, wherein the ridge structure comprises (1) or (2) and the ridge structure further comprises a collateral section having parallel sides and adjacent to the tapered section.

5. The laser of claim 1, wherein the ridge structure comprises (1) and wherein the ridge structure is linear and the front face is the lasing face having the width $w_m$.

6. The laser of claim 5, wherein the tapered section has the lasing face having the width $w_m$ and the back face having the width $w_M$.

7. The laser of claim 5, the linear ridge structure further comprising a collateral section adjacent to the tapered section, the collateral section having the lasing face having the width $w_m$ and parallel sides extending from the lasing face to a first face opposite the lasing face,
wherein the diverging sides of the tapered section extend from the first face to a second face having the width $w_M$.

8. The laser of claim 7, wherein the second face having the width $w_M$ is the back face.

9. The laser of claim 7, the linear ridge structure further comprising a second collateral section having parallel sides extending to a third face opposite the second face.

10. The laser of claim 9, wherein the parallel sides of the second collateral section extend from the second face having the width $w_M$ and the third face is the back face.

11. The laser of claim 7, wherein the tapered section further comprises additional sides converging to a third face opposite the second face.

12. The laser of claim 11, the linear ridge structure further comprising a second collateral section having parallel sides extending to a fourth face opposite the third face.

13. The laser of claim 12, wherein the additional converging sides extend from the second face having the width $w_M$ and the parallel sides of the second collateral section extend from the third face and the fourth face is the back face.

14. The laser of claim 13, wherein the back face has the width $w_m$.

15. The laser of claim 1, wherein the ridge structure comprises (2) and wherein the ridge structure is linear.

16. The laser of claim 15, the linear ridge structure further comprising a second tapered section having sides between the front face and the back face and which extend away from the front face and converge towards the back face.

17. The laser of claim 1, wherein the ridge structure comprises (2) and wherein the ridge structure is continuous.

18. The laser of claim 17, wherein the tapered section is part of a first central portion having the front face and the back face,
wherein the continuous ridge structure further comprises a first connecting portion having outer and inner sides, both of which extend away from the back face and towards the front face, the first connecting portion configured to optically couple the front face to the back face.

19. The laser of claim 1, wherein the ridge structure comprises (1) or (2) wherein the diverging sides of the tapered section are curved.

20. The laser of claim 19, wherein the curve is parabolic.

21. The laser of claim 1, wherein the ridge structure comprises (3) and is linear.

22. The laser of claim 21, wherein the laser emission has a wavelength in a range of from 4 µm to 5 µm and the distributed feedback grating is characterized by a duty cycle greater than 0.45.

23. The laser of claim 1, wherein the ridge structure comprises (1) or (2).

24. The laser of claim 16, the linear ridge structure further comprising a collateral section having parallel sides, the collateral section extending between the first and second tapered sections.

25. The laser of claim 24, wherein the second tapered section has the front face and the converging sides extend from the front face to the first face having the width $w_m$ opposite the front face; the parallel sides of the collateral section extend from the first face to a second face opposite the first face; and the tapered section has the back face having the width $w_M$ and the diverging sides of the tapered section extend from the second face to the back face.

26. The laser of claim 25, wherein the front face has the width $w_M$.

* * * * *

UNITED STATES PATENT AND TRADEMARK OFFICE
CERTIFICATE OF CORRECTION

PATENT NO. : 12,413,047 B2
APPLICATION NO. : 17/768052
DATED : September 9, 2025
INVENTOR(S) : Luke J. Mawst et al.

Page 1 of 1

It is certified that error appears in the above-identified patent and that said Letters Patent is hereby corrected as shown below:

In the Specification

Column 5, Line 7:
Delete the phrase "they axis" and replace with --the $y$ axis--.

Column 6, Lines 26-27:
Delete the phrase "they direction" and replace with --the $y$ direction--.

Column 6, Line 34:
Delete the phrase "width wand" and replace with --width $w_f$ and--.

Column 6, Line 58:
Delete the phrase "nay" and replace with --$n_{eff}$--.

Column 7, Lines 7-8:
Delete the phrase "width wand" and replace with --width $w_f$ and--.

Column 7, Line 32:
Delete the phrase "width wand" and replace with --width $w_f$ and--.

Column 8, Line 30:
Delete the phrase "width wand" and replace with --width $w_f$ and--.

Signed and Sealed this
Fourteenth Day of October, 2025

John A. Squires
*Director of the United States Patent and Trademark Office*